(12) United States Patent
Yao et al.

(10) Patent No.: US 11,735,641 B2
(45) Date of Patent: *Aug. 22, 2023

(54) FINFET STRUCTURE WITH AIRGAP AND METHOD OF FORMING THE SAME

(71) Applicant: Taiwan Semiconductor Manufacturing Co., Ltd., Hsinchu (TW)

(72) Inventors: Chien Ning Yao, Hsinchu (TW); Kai-Hsuan Lee, Hsinchu (TW); Sai-Hooi Yeong, Hsinchu County (TW); Wei-Yang Lee, Taipei (TW); Kuan-Lun Cheng, Hsin-Chu (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/533,277

(22) Filed: Nov. 23, 2021

(65) Prior Publication Data

US 2022/0085185 A1    Mar. 17, 2022

Related U.S. Application Data

(63) Continuation of application No. 16/788,184, filed on Feb. 11, 2020, now Pat. No. 11,189,706.

(51) Int. Cl.
*H01L 29/49*  (2006.01)
*H01L 29/423*  (2006.01)
*H01L 21/3213*  (2006.01)
*H01L 29/66*  (2006.01)
*H01L 29/417*  (2006.01)

(52) U.S. Cl.
CPC .... *H01L 29/4991* (2013.01); *H01L 21/32135* (2013.01); *H01L 29/41791* (2013.01); *H01L 29/42364* (2013.01); *H01L 29/66795* (2013.01)

(58) Field of Classification Search
CPC .......... H01L 29/4991; H01L 29/41791; H01L 29/515; H01L 29/41775; H01L 21/28247; H01L 29/0649
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |

(Continued)

*Primary Examiner* — Changhyun Yi
(74) *Attorney, Agent, or Firm* — Haynes and Boone, LLP

(57) ABSTRACT

Semiconductor device and the manufacturing method thereof are disclosed herein. An exemplary semiconductor device comprises a semiconductor fin formed on a substrate; and a gate structure disposed over a channel region of the semiconductor fin, the gate structure including a gate dielectric layer and a gate electrode, wherein the gate dielectric layer includes a bottom portion and a side portion, and the gate electrode is separated from the side portion of the gate dielectric layer by a first air gap.

20 Claims, 32 Drawing Sheets

(56) References Cited

U.S. PATENT DOCUMENTS

| | | |
|---|---|---|
| 9,236,300 B2 | 1/2016 | Liaw |
| 9,520,482 B1 | 12/2016 | Chang et al. |
| 9,576,814 B2 | 2/2017 | Wu et al. |
| 10,026,824 B1 | 7/2018 | Chanemougame et al. |
| 11,189,706 B2 * | 11/2021 | Yao .................... H01L 29/4991 |
| 2015/0221742 A1 | 8/2015 | Yi et al. |

* cited by examiner

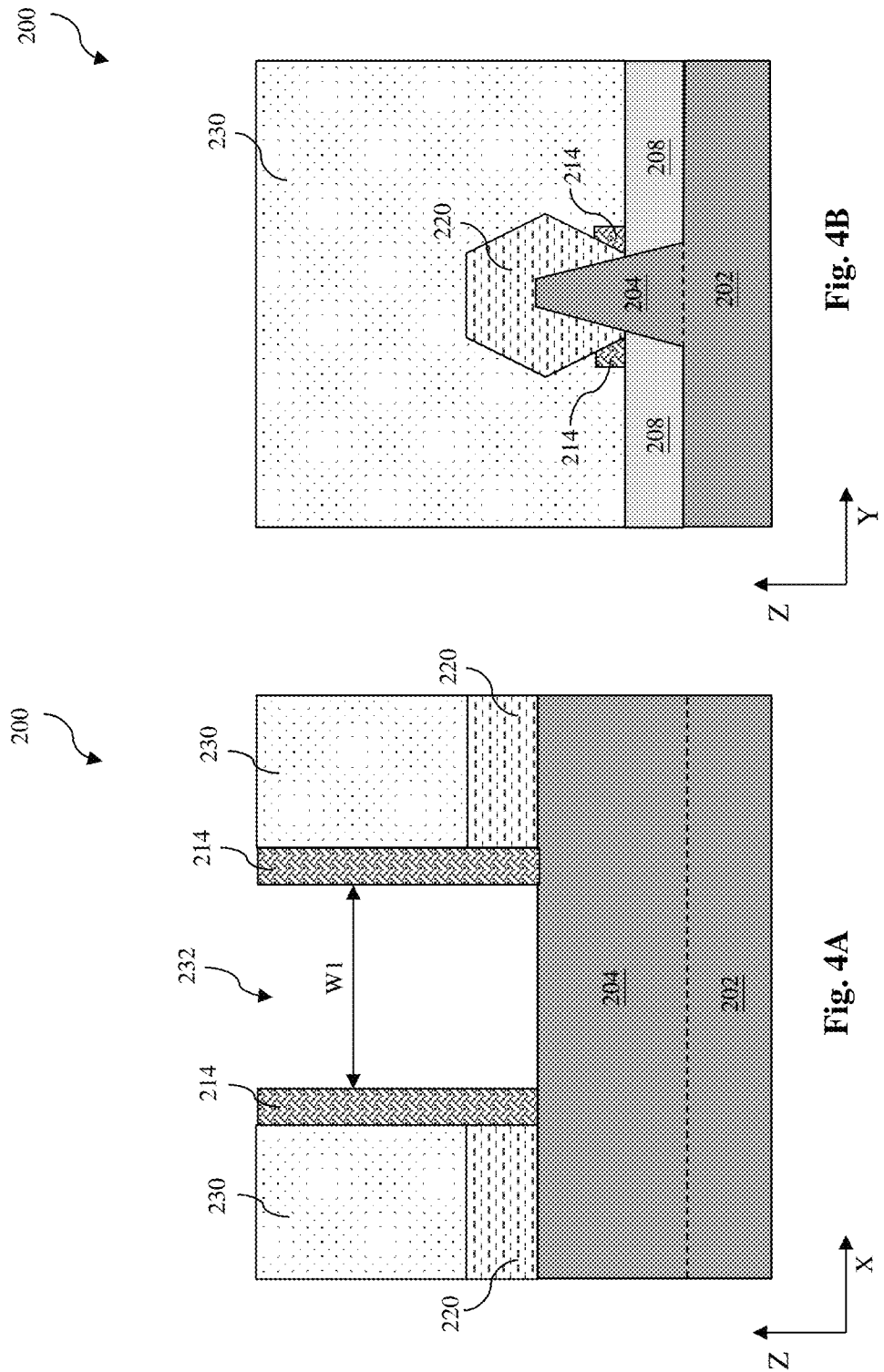

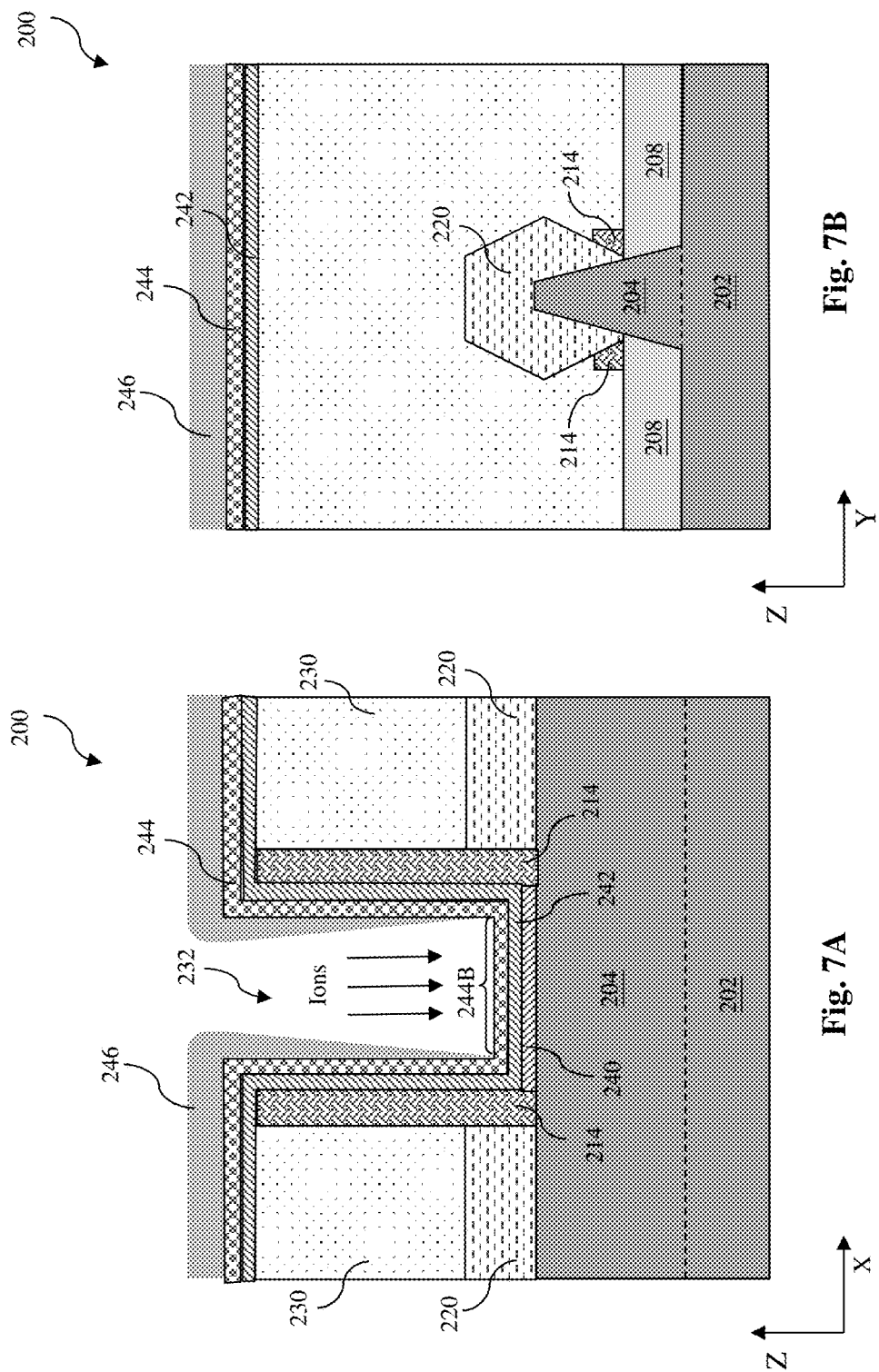

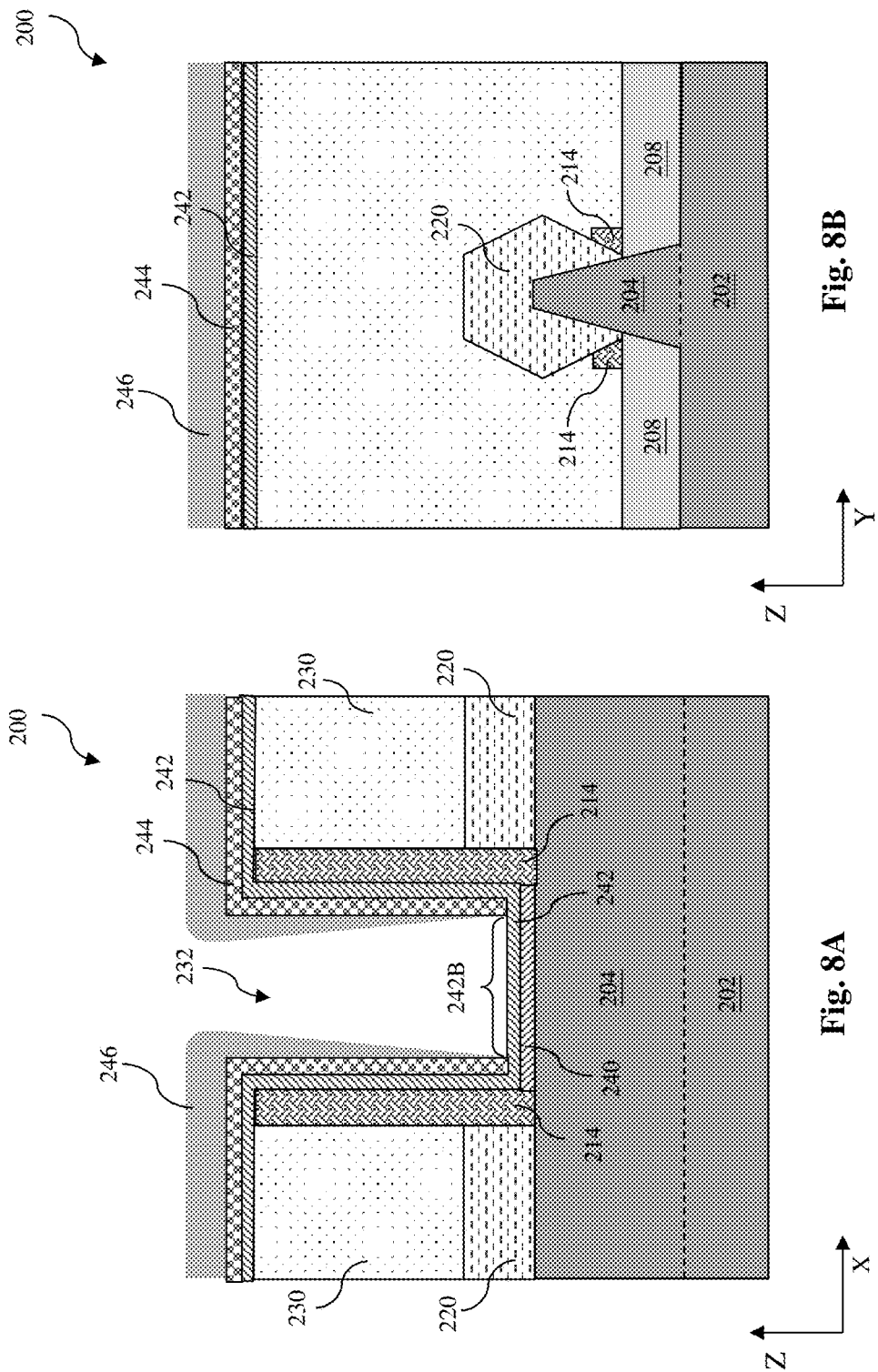

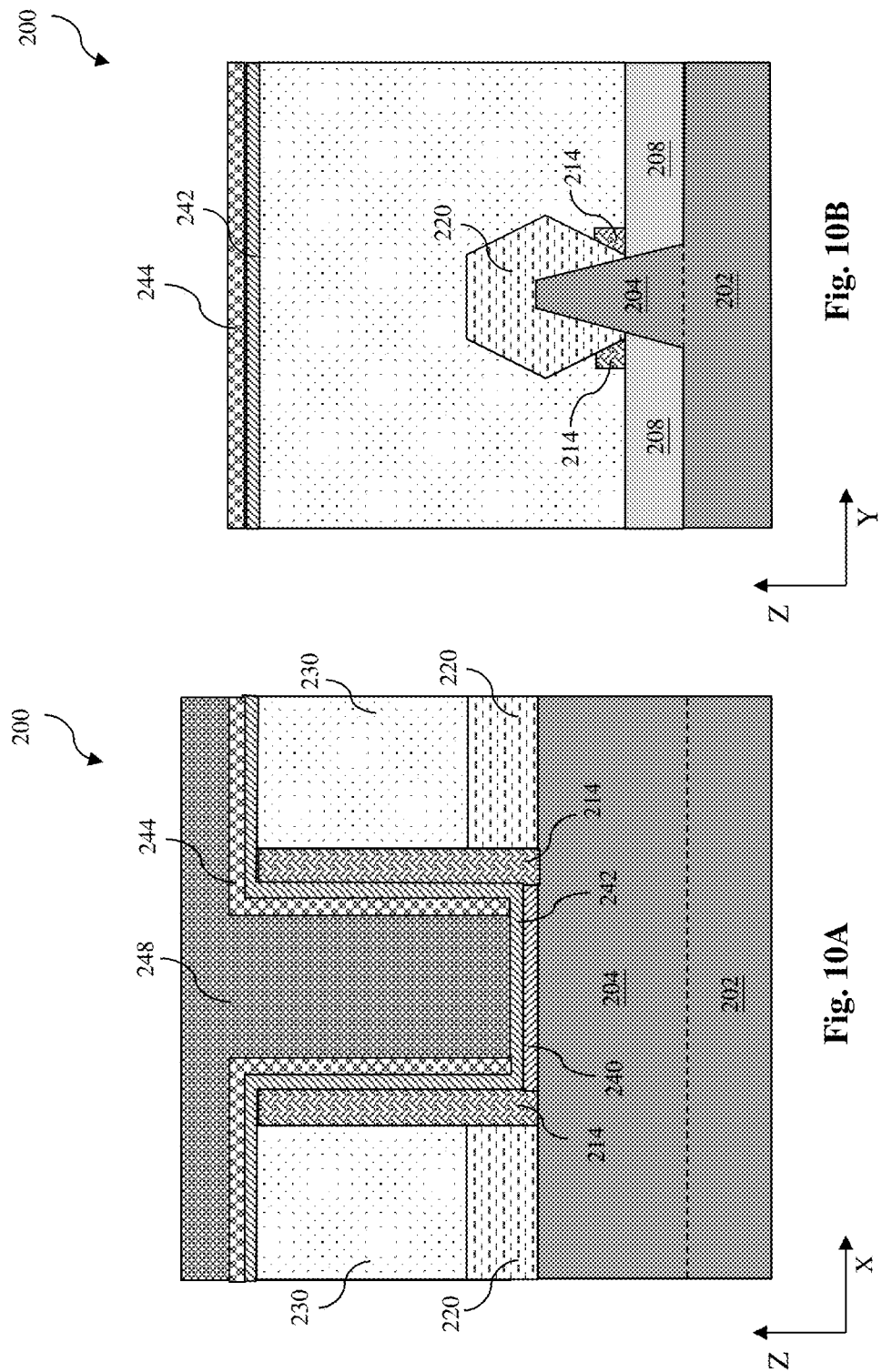

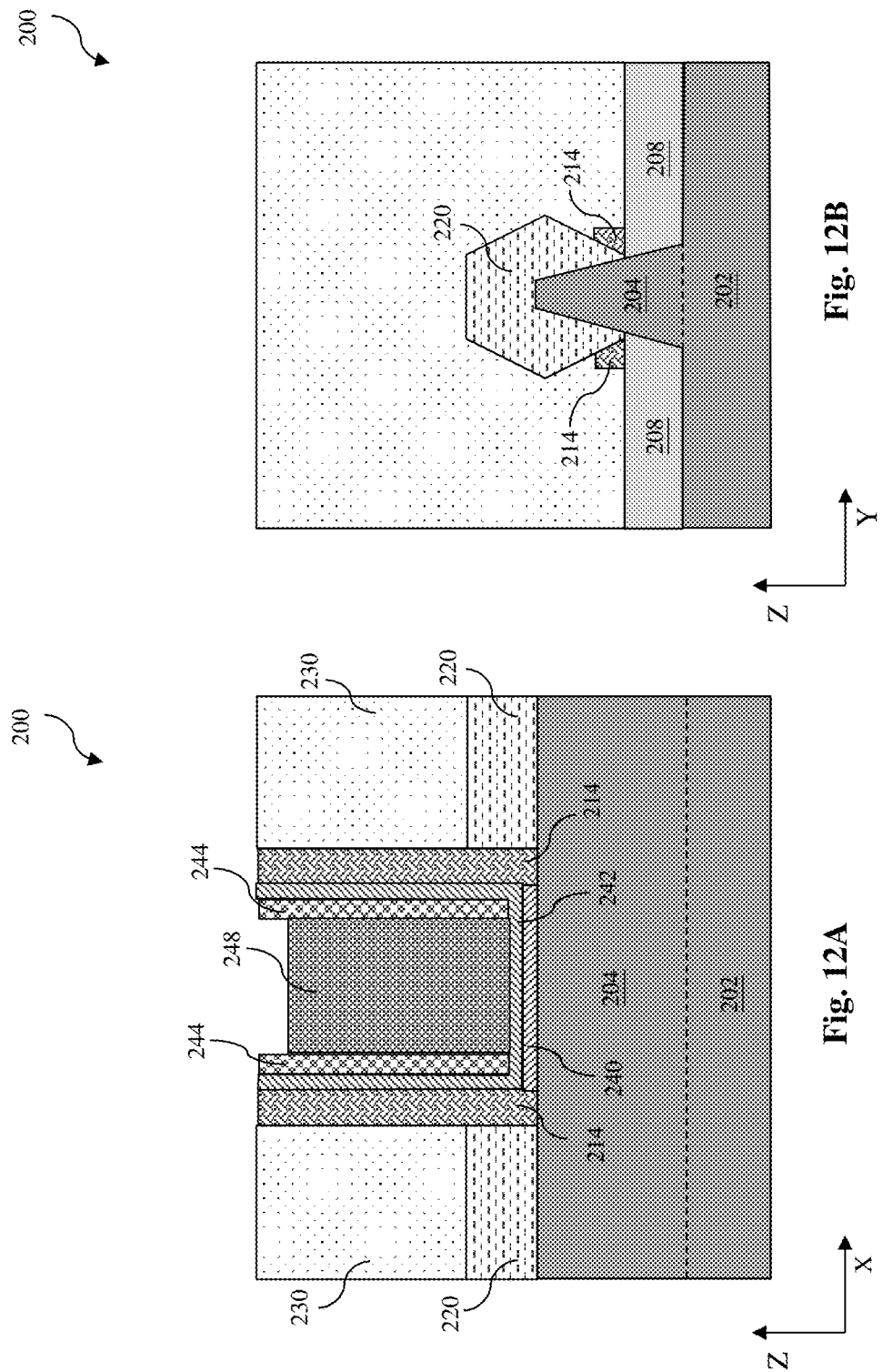

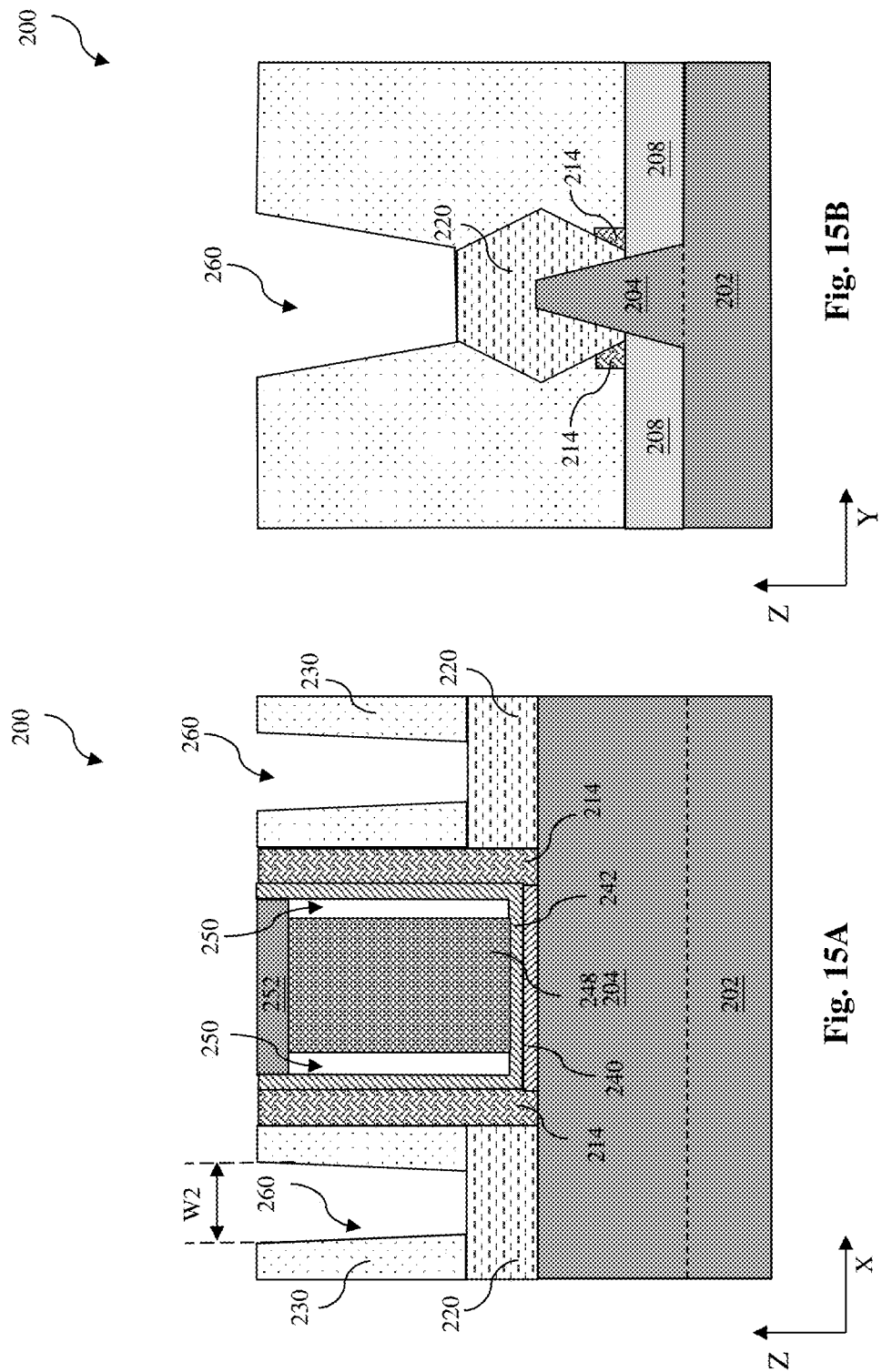

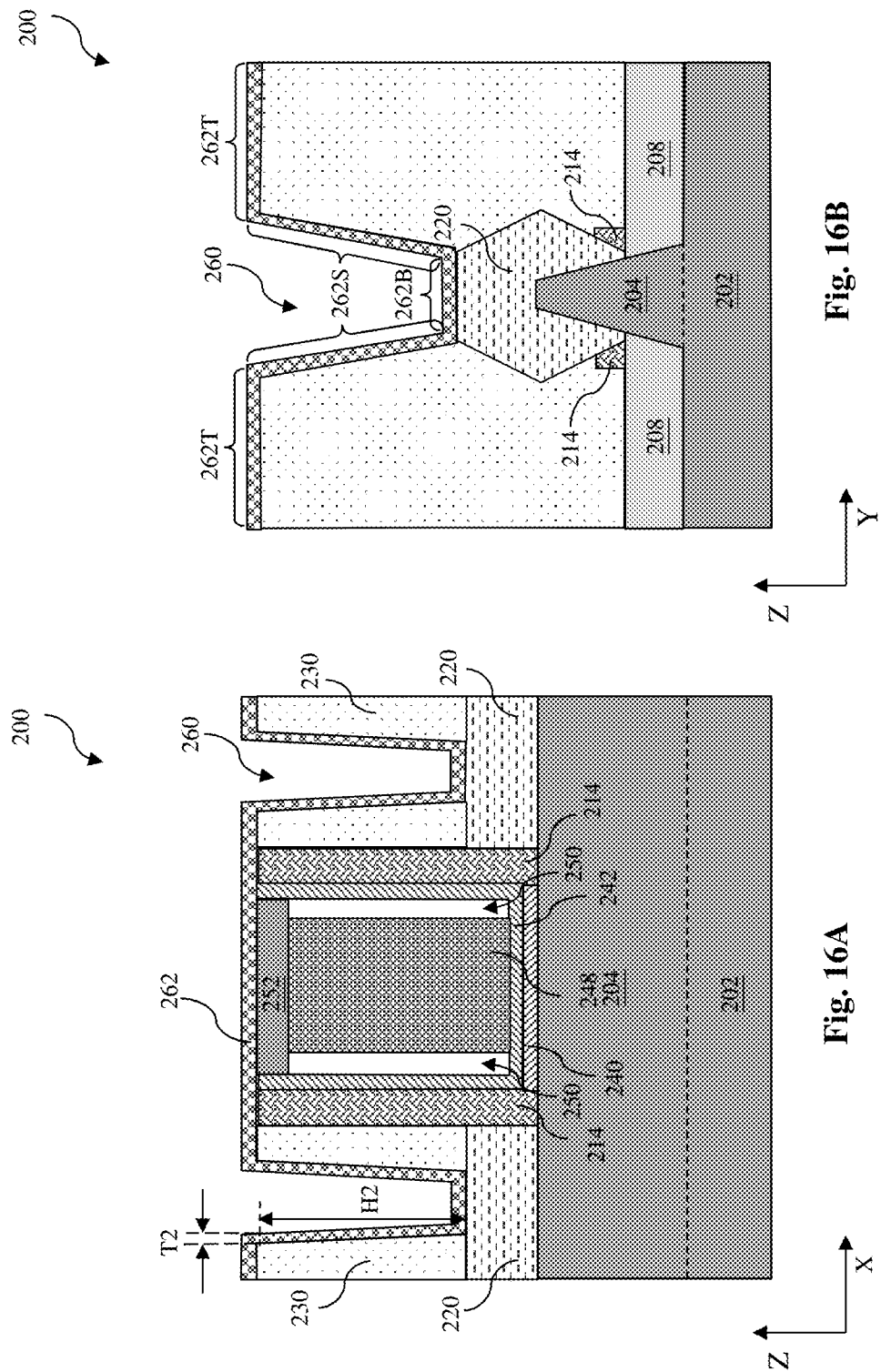

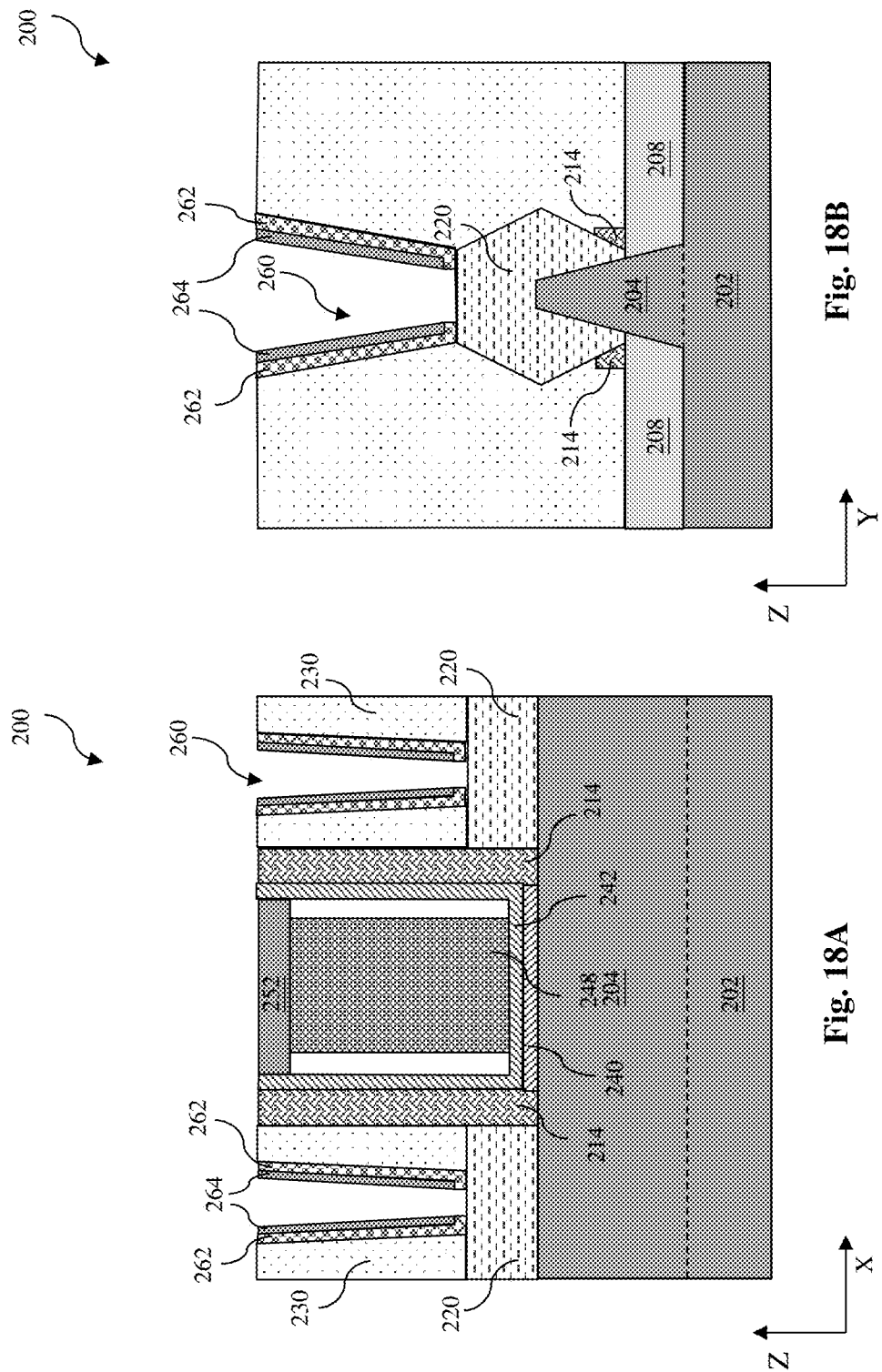

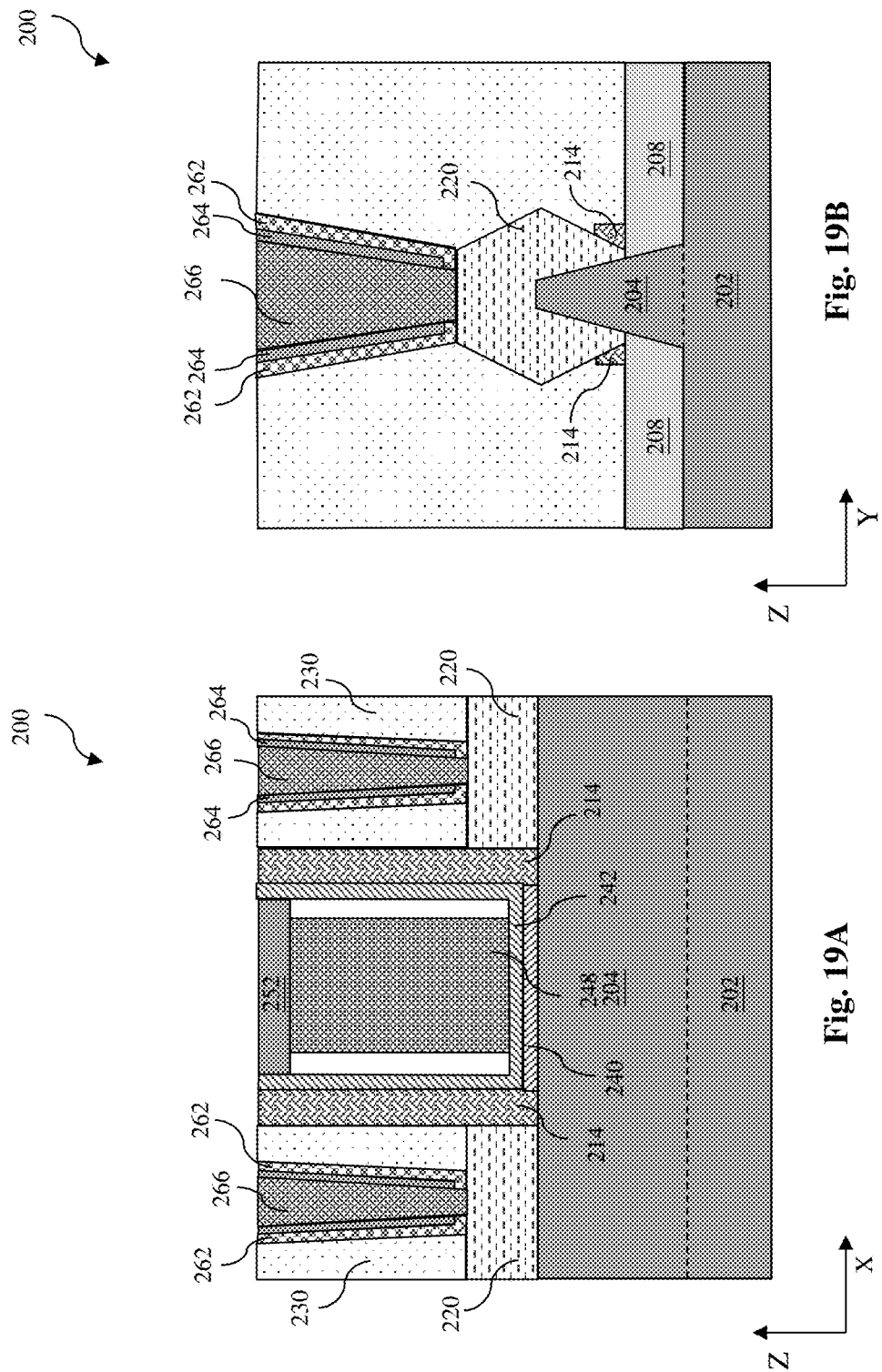

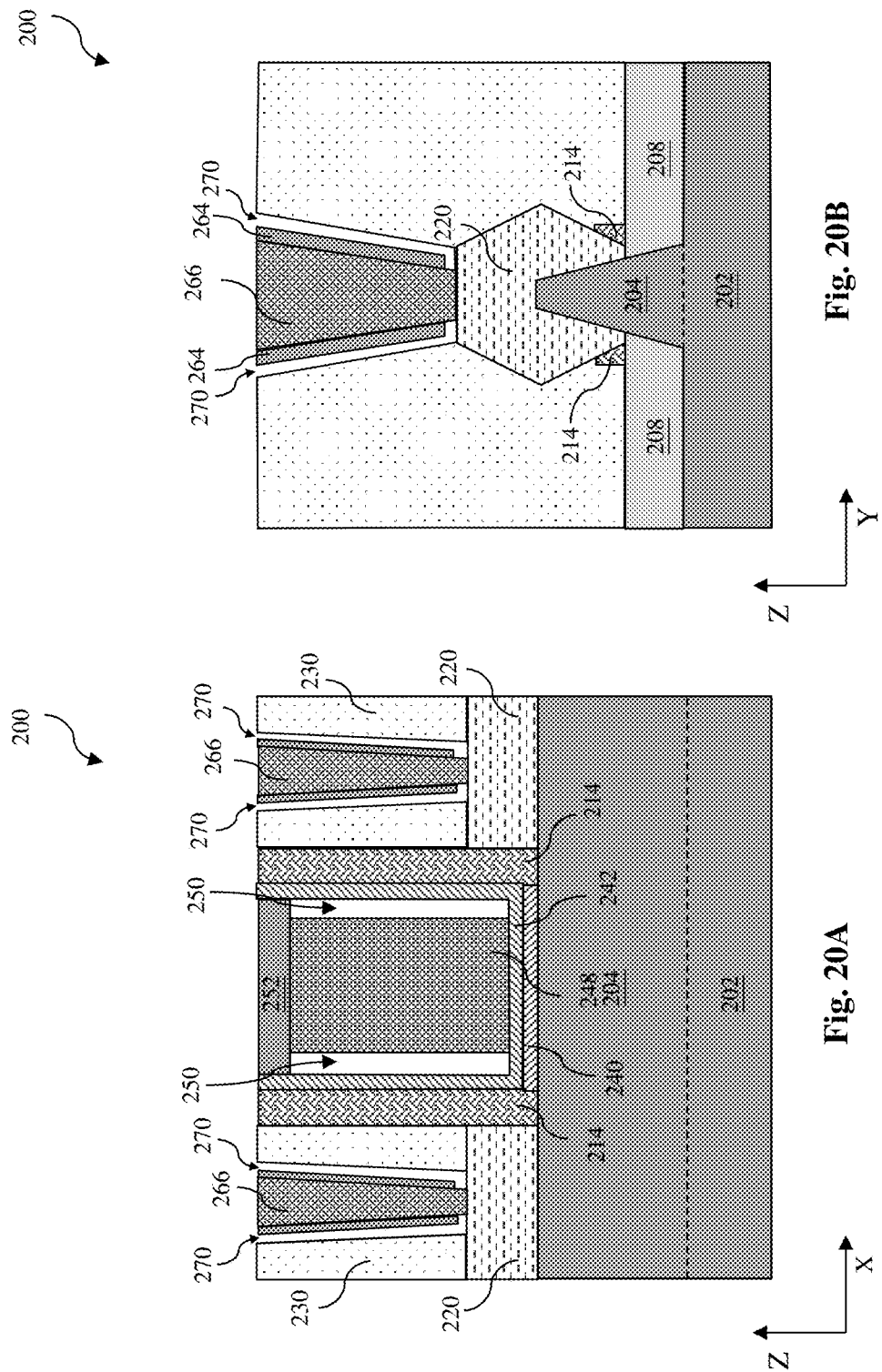

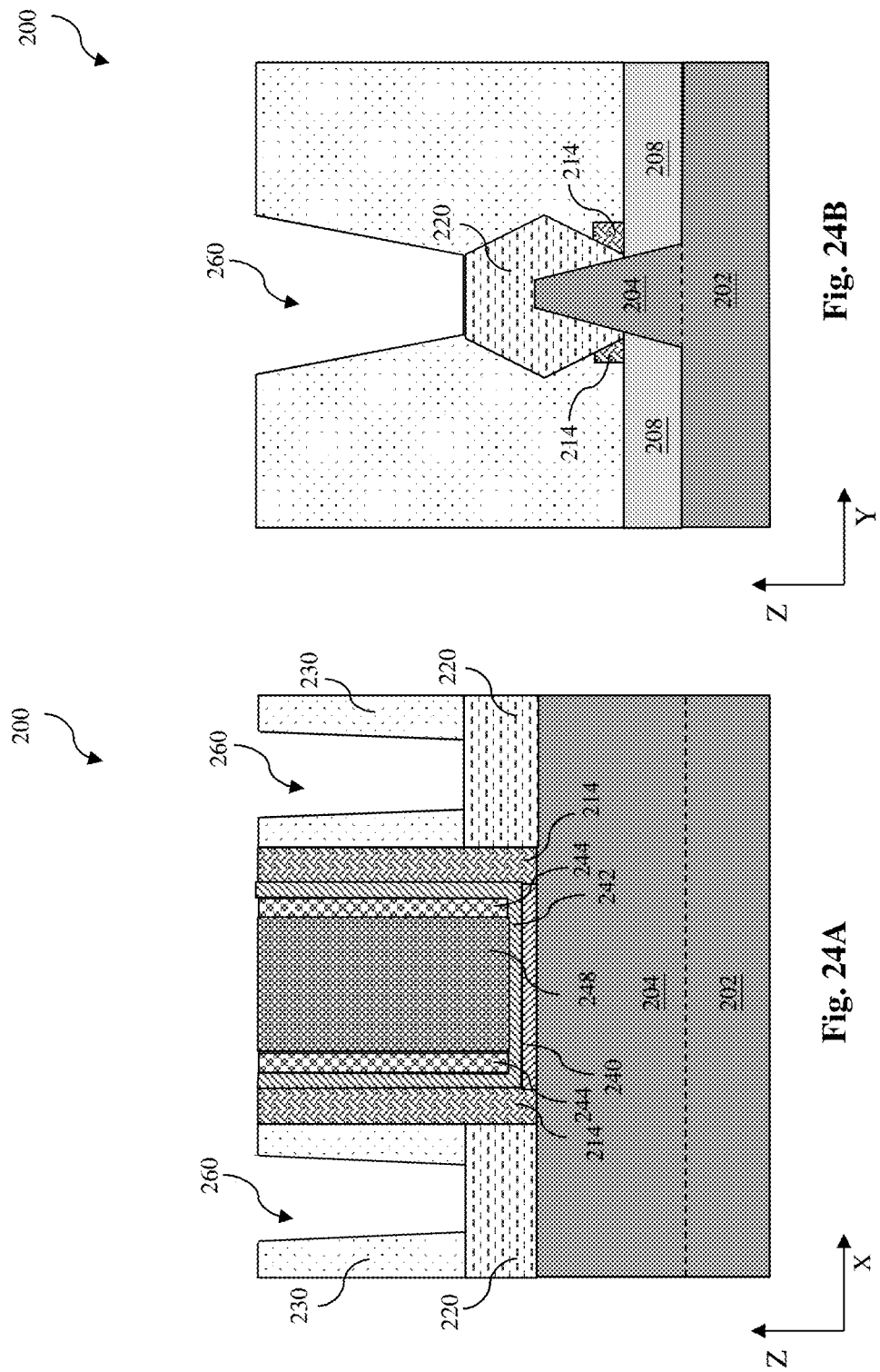

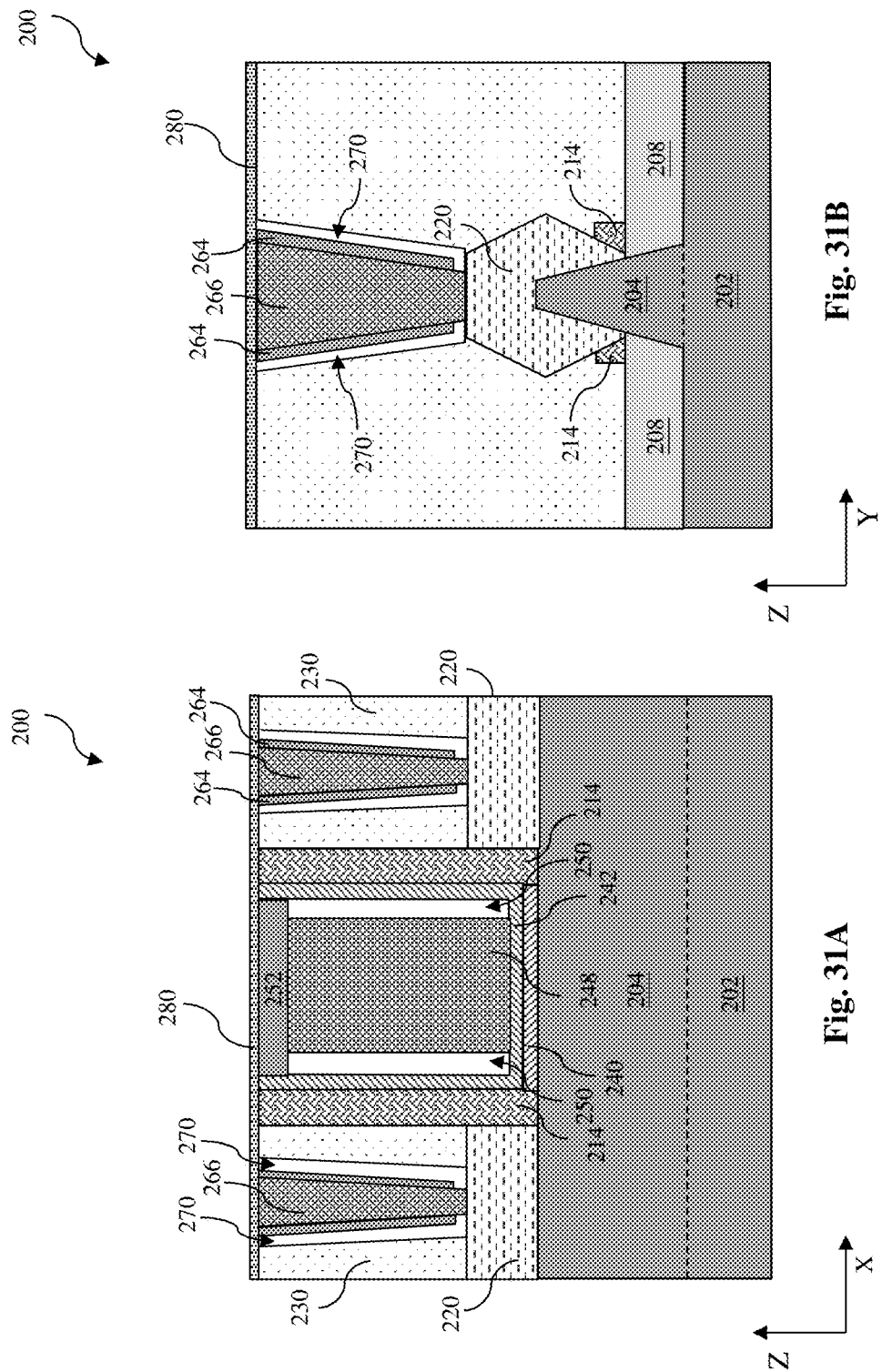

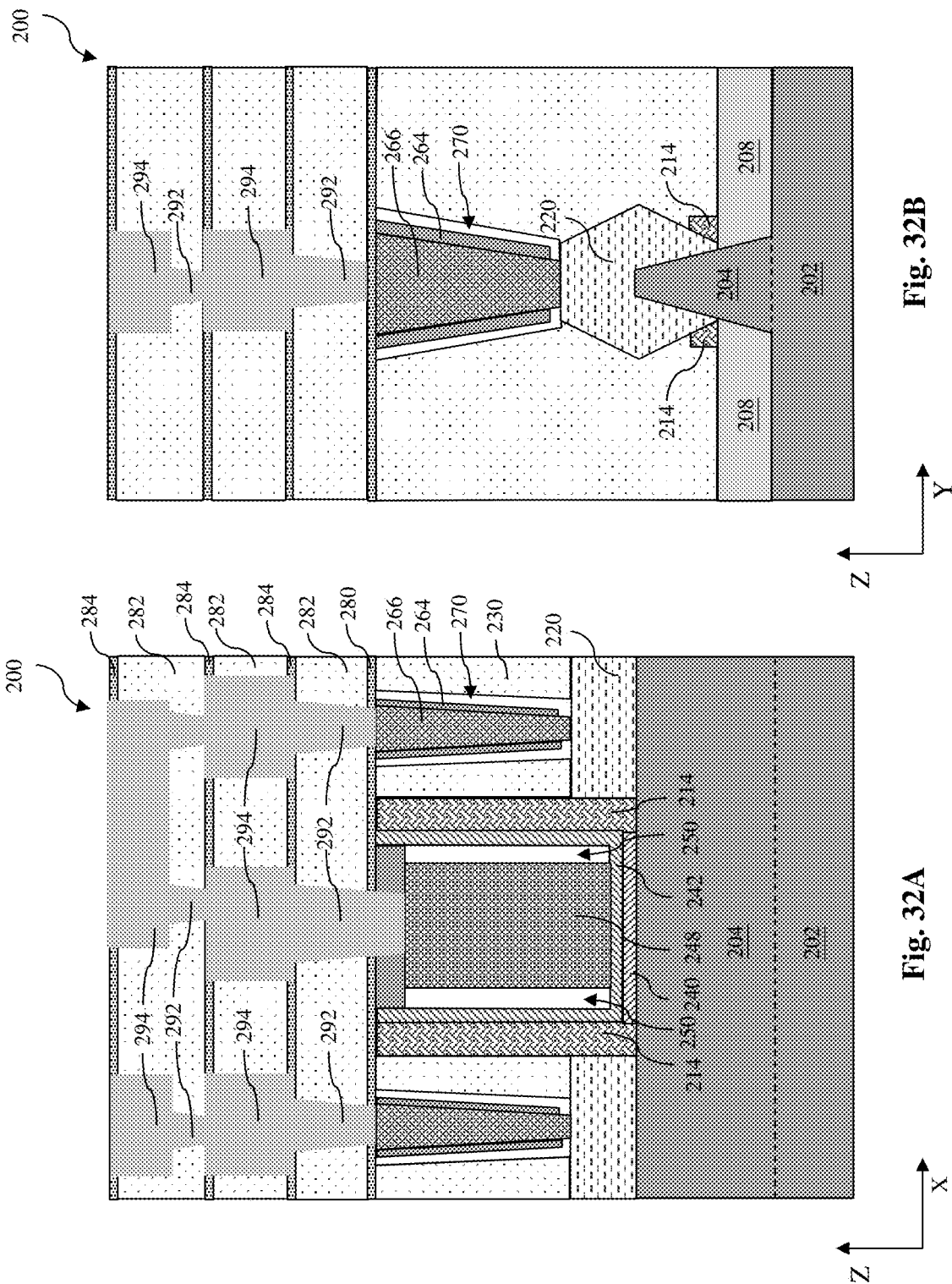

FINFET STRUCTURE WITH AIRGAP AND METHOD OF FORMING THE SAME

PRIORITY DATA

The present application is a continuation of U.S. patent application Ser. No. 16/788,184, filed Feb. 11, 2020, which is hereby incorporated by reference in its entirety.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

However, such scaling down has also increased the complexity of processing and manufacturing ICs and, for these advances to be realized, similar developments in IC processing and manufacturing are needed. For example, high-k dielectric material in gate stack is required for device scaling. However, the high-k material may increase the parasitic capacitance and impede the alternating current (AC) performance of the semiconductor device. In addition, in a conventional semiconductor structure, air gaps may be formed between S/D contact and metal gate to reduce the parasitic capacitance. However, the conventional air gaps are formed before contact plug formation, thus the device may be suffered with the short circuit due to the overlay shifting of S/D contact etching. Accordingly, improvements are needed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A-22A illustrate cross-sectional views along plane A-A' shown in FIG. 2B of the example semiconductor device at intermediate stages of the method of FIG. 1 in accordance with some embodiments of the present disclosure;

FIGS. 3B-22B illustrate cross-sectional views along plane B-B' shown in FIG. 2B of the example semiconductor device at intermediate stages of the method of FIG. 1 in accordance with some embodiments of the present disclosure;

FIGS. 24A-32A illustrate cross-sectional views along plane A-A' shown in FIG. 2B of the example semiconductor device at intermediate stages of the method of FIG. 23 in accordance with some other embodiments of the present disclosure; and FIGS. 24B-32B illustrate cross-sectional views along plane B-B' shown in FIG. 2B of the example semiconductor device at intermediate stages of the method of FIG. 23 in accordance with some other embodiments of the present disclosure.

DETAILED DESCRIPTION

Figure 1:
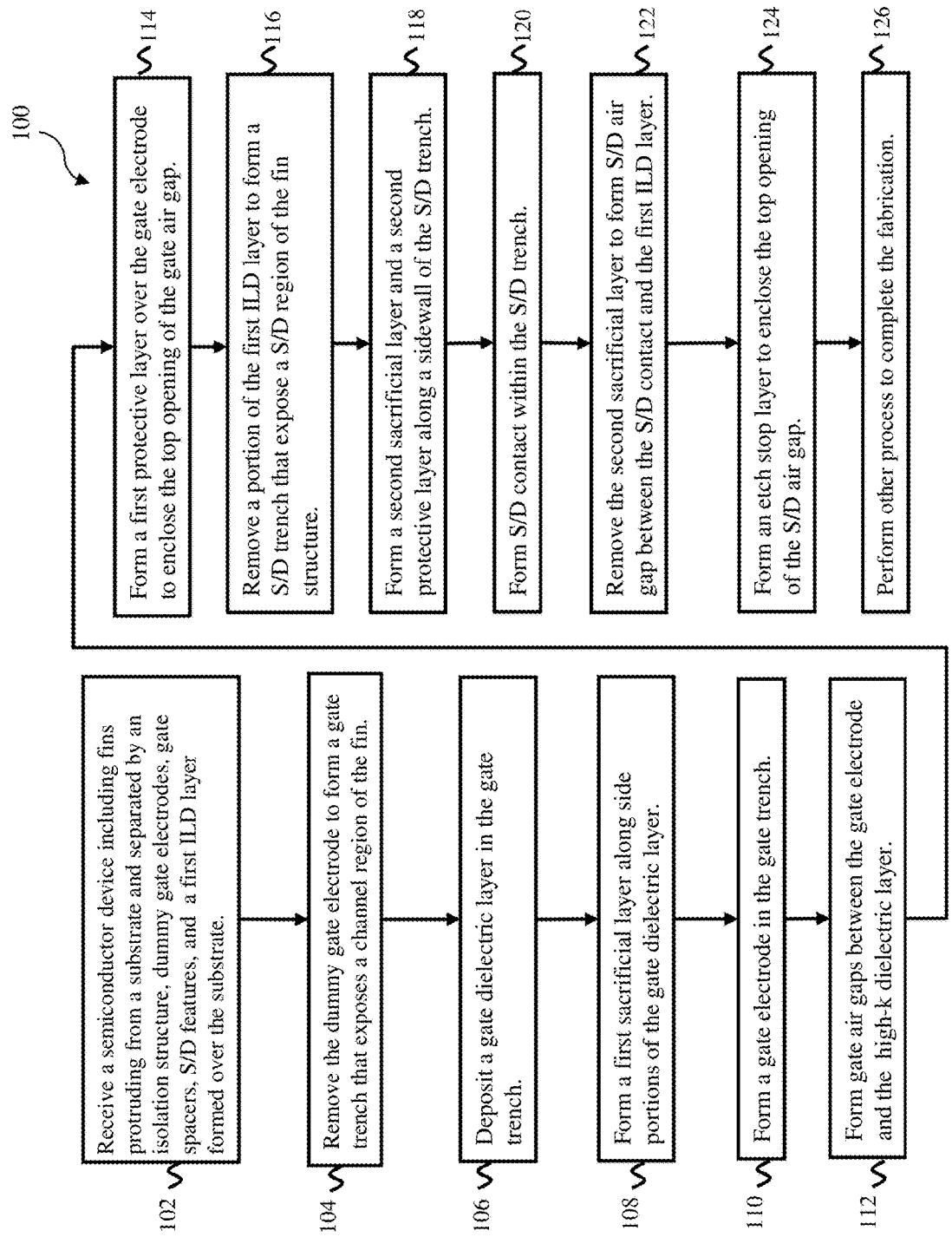
FIG. 1 illustrates a flowchart of an example method for making a semiconductor device in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices and the fabrication thereof. Due to the scaling down of the semiconductor device, the geometry size between different components of the semiconductor device is getting smaller and smaller which may cause some issues and damage the performance of the semiconductor device. For example, in a conventional semiconductor device, parasitic capacitance between the metal gate and the S/D contact are large due to the high-k dielectric material therebetween. In addition, due to the scaling down of the device, the safe etching margin is reduced and the punch through may happy between the metal gate and the S/D contact, which may induce low yield and damage the performance of the semiconductor device.

The present disclosure provides a semiconductor device with air gaps formed between the gate electrode and the high-k dielectric layer and between the S/D contact and the device level interlayer dielectric (ILD) layer. In some embodiments, a protective dielectric layer is formed over the air gaps to cover the top opening thereof. These air gaps may reduce the parasitic capacitance between the metal gate and the S/D contact and may also increase the safe etching margin for contacts/vias formation, thereby to mitigate the punch through and/or current leakage between the metal gate and the S/D contact and improve the performance of the semiconductor device. Of course, these advantages are merely exemplary, and no particular advantage is required for any particular embodiment.

Figures 2A, 2B:
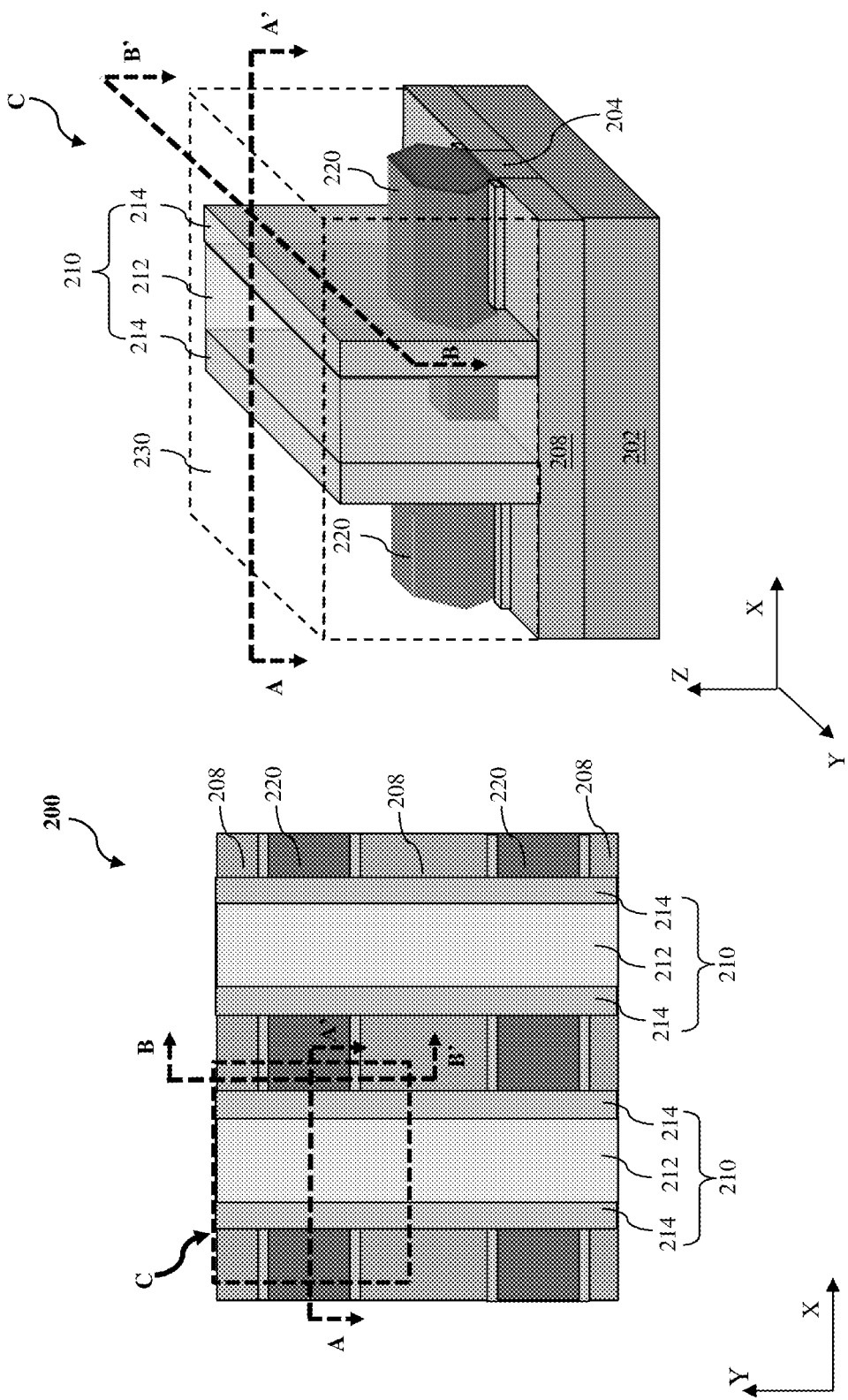
FIG. 2A illustrates a top view of an example semiconductor device in accordance with some embodiments of the present disclosure.
FIG. 2B illustrates a three-dimensional perspective view of a portion C in the example semiconductor device in FIG. 2A in accordance with some embodiments of the present disclosure.

FIG. 1 illustrates a flow chart of a method 100 for forming a semiconductor device 200 (hereafter called "device 200" in short) in accordance with some embodiments of the present disclosure. Method 100 is merely an example and is not intended to limit the present disclosure beyond what is explicitly recited in the claims. Additional operations can be performed before, during, and after method 100, and some operations described can be replaced, eliminated, or moved around for additional embodiments of the method. Method 100 is described below in conjunction with other figures, which illustrate various top, three-dimensional and cross-sectional views of device 200 during intermediate steps of method 100. In particular, FIG. 2A illustrates a top view of device 200 initially provided (that is, in an X-Y plane) and FIG. 2B illustrates a three-dimensional view of portion C of device 200 according to some embodiments of the present disclosure. FIGS. 3A-21A illustrate cross-sectional views of device 200 taken along plane A-A' shown in FIGS. 2A and 2B (that is, along an X-direction). FIGS. 3B-21B illustrate cross-sectional views of device 200 taken along plane B-B' shown in FIGS. 2A and 2B (that is, along a Y-direction).

Device 200 may be an intermediate device fabricated during processing of an integrated circuit (IC), or a portion thereof, that may comprise static random-access memory (SRAM) and/or other logic circuits, passive components such as resistors, capacitors, and inductors, and active components such as p-type FETs (PFETs), n-type FETs (NFETs), fin-like FETs (FinFETs), metal-oxide semiconductor field effect transistors (MOSFET), complementary metal-oxide semiconductor (CMOS) transistors, bipolar transistors, high voltage transistors, high frequency transistors, and/or other memory cells. Device 200 can be a portion of a core region (often referred to as a logic region), a memory region (such as a static random access memory (SRAM) region), an analog region, a peripheral region (often referred to as an input/output (I/O) region), a dummy region, other suitable region, or combinations thereof, of an integrated circuit (IC). In some embodiments, device 200 may be a portion of an IC chip, a system on chip (SoC), or portion thereof. The present disclosure is not limited to any particular number of devices or device regions, or to any particular device configurations. For example, though device 200 as illustrated is a three-dimensional FET device, the present disclosure may also provide embodiments for fabricating planar FET devices.

Referring to FIGS. 1, 2A and 2B, at operation 102, method 100 provides a semiconductor device 200 (hereinafter "device 200"). Device 200 includes one or more fins 204 protruding from a substrate 202 and separated by an isolation structure 208. Substrate 202 may be a bulk substrate that includes silicon (Si). Alternatively or additionally, the bulk substrate includes another elementary semiconductor, a compound semiconductor, an alloy semiconductor, or combinations thereof. In some embodiments, substrate 202 includes n-type doped regions (for example, n-type wells) doped with n-type dopants, such as phosphorus (for example, $^{31}P$), arsenic, other n-type dopant, or combinations thereof. In some embodiments, substrate 202 includes p-type doped region (for example, p-type wells) doped with p-type dopants, such as boron (for example, $^{10}B$, BF2), indium, other p-type dopant, or combinations thereof.

Semiconductor fins 204 are formed over substrate 202 and are oriented substantially parallel to one another. Each of fins 204 has at least one channel region and at least one source region and one drain region defined along their length in the x-direction. In some embodiments, fins 204 are portions of substrate 202 (such as a portion of a material layer of substrate 202). In some other embodiments, fins 204 are defined in a material layer, such as one or more semiconductor material layers, overlying substrate 202. The semiconductor layers can include any suitable semiconductor materials, such as Si, germanium (Ge), silicon germanium (SiGe), other suitable semiconductor materials, or combinations thereof. Fins 204 are formed by any suitable process including various deposition, photolithography, and/or etching processes.

Isolation structure 208 is formed over substrate 202 and electrically isolates active device regions and/or passive device regions of device 200. Isolation structure 208 can be configured as different structures, such as a shallow trench isolation (STI) structure, a deep trench isolation (DTI) structure, a local oxidation of silicon (LOCOS) structure, or combinations thereof. In some embodiments, isolation structure 208 includes an isolation material, such as silicon oxide (SiO), silicon nitride (SiN), silicon oxynitride (SiON), other suitable isolation material, or combinations thereof. Formation of isolation structure 208 includes deposition process such as chemical vapor deposition (CVD), physical vapor deposition (PVD), atomic layer deposition (ALD), and planarization process such as chemical mechanical planarization (CMP).

Still referring to FIGS. 2A and 2B, one or more dummy gate structures 210 are disposed over substrate 202 and fins 204. Each dummy gate structure 210 may include a dummy gate electrode 212 and gate spacers 214 disposed along sidewalls of the gate stack 212. Dummy gate electrode 212 may comprise polysilicon (or poly) and are formed over channel regions of the fins 204 that interposing source regions and drain regions (both referred to as source/drain (S/D) regions) of fins 204. Gate spacers 214 including silicon, oxygen, carbon, nitrogen, other suitable material, or combinations thereof (for example, SiO, SiN, SiON, or silicon carbide (SiC), silicon carbon nitride (SiCN), silicon oxycarbonitride (SiOCN)) are formed by suitable process such as deposition, etching, and/or other suitable processes. Dummy gate structures 210 may include other components such as one or more gate dielectric layers disposed over fins 204 and below dummy gate electrodes 212 and gate hard mask layers disposed over dummy gate electrodes 212.

Device 200 also includes S/D features 220 epitaxially grown over the S/D regions of fins 204. Epitaxial S/D features 220 includes semiconductor material such as silicon germanium (SiGe), silicon phosphide (SiP), or silicon carbide (SiC). An epitaxy process can implement CVD deposition techniques (for example, vapor-phase epitaxy (VPE), ultra-high vacuum CVD (UHV-CVD), low pressure CVD (LPCVD), and/or plasma-enhanced CVD (PECVD)), molecular beam epitaxy (MBE), other suitable selective epitaxial growth (SEG) processes, or combinations thereof.

Device 200 also includes a first interlayer dielectric (ILD) layer 230 disposed over substrate 202 and fins 204 and between gate structures 210. ILD layer 230 is omitted in FIG. 2A and is shown as dashed lines in FIG. 2B, such that the semiconductor components covered by ILD layer 230 can be clearly shown in FIGS. 2A and 2B. The first ILD layer 230 may include SiO, SiN, SiON, tetraethylorthosilicate (TEOS) formed oxide, un-doped silicate glass, or doped silicon oxide such as borophosphosilicate glass (BPSG), fused silica glass (FSG), phosphosilicate glass (PSG), boron doped silicon glass (BSG), low-k (K<3.9) dielectric material, other suitable dielectric material, or combinations thereof. In some embodiments, the first ILD layer 230 may be formed by a deposition process (for example, furnace chemical vapor deposition (FCVD)) to cover substrate 202, isolation structure 208, S/D features 220, and dummy gate structures 210. Subsequently, a CMP process and/or other planarization process may be performed to expose gate structures 210.

Figures 3A, 3B:
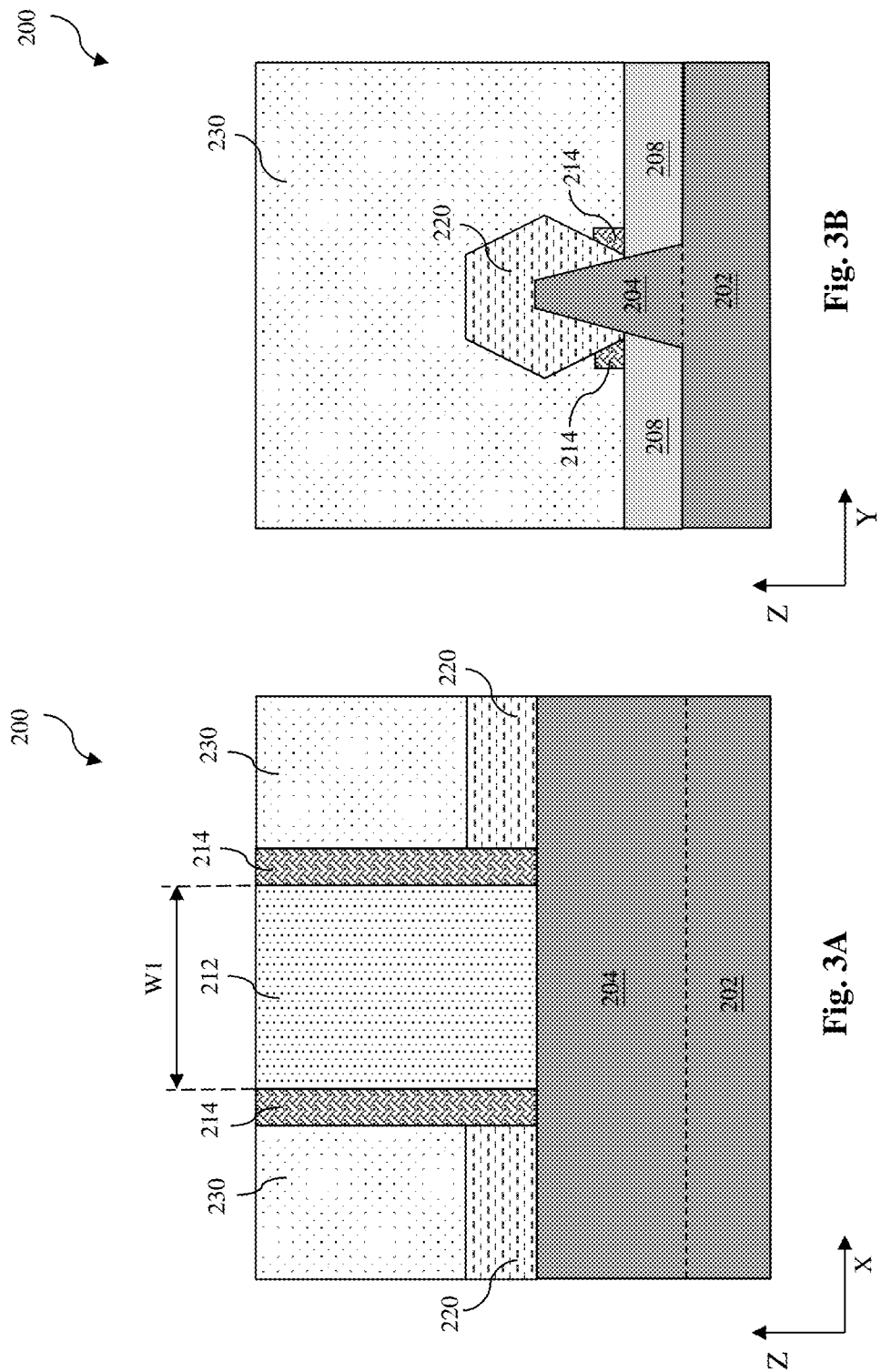

FIGS. 3A and 3B illustrate cross-sectional views of device 200 along plane A-A' and B-B' shown in FIGS. 2A and 2B, respectively. In some embodiments, as depicted in FIG. 3A, a width W of dummy gate electrode 212 in the X-direction is about 10 nanometers (nm) to about 30 nm. It is understood components included in device 200 are not limited to the numbers and configurations as shown in FIGS. 2A, 2B, 3A and 3B. More or less components, for example, more or less gate structures and/or S/D features, may be included in device 200.

Now referring to FIGS. 1, 4A and 4B, at operation 104, dummy gate electrode 212 is removed to expose the channel region of fin 204. A gate trench 232 is formed between gate spacers 214 after removing dummy gate electrode 212. As depicted in FIG. 4A, the channel region of fin 204 is exposed in gate trench 232 and a width of gate trench 232 is the same as the width W of dummy gate electrode, which is about 10 nm to about 30 nm. In some embodiments, removing dummy gate electrode 212 includes one or more etching processes, such as wet etching, dry etching, or other etching techniques.

Figures 5A, 5B:
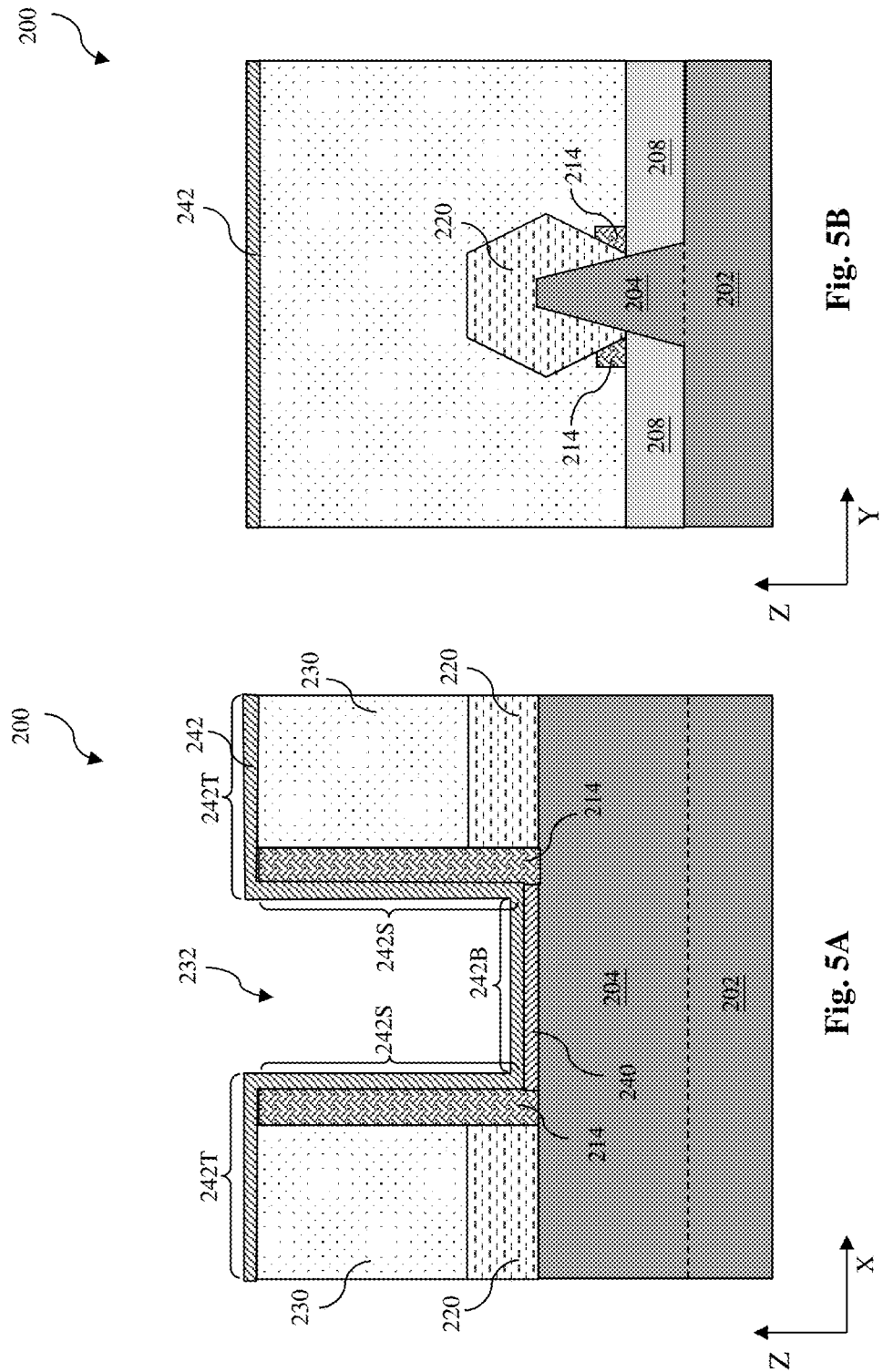

Now referring to FIGS. 1, 5A and 5B, at operation 106, a gate dielectric layer is formed over the substrate and within the gate trench 232. In some embodiments, the gate dielectric layer is a gate dielectric layer 242. In some embodiments, the gate dielectric layer also includes an interfacial layer 240 disposed between the top surface of fin 204 exposed in gate trench 232 and the gate dielectric layer 242. In some embodiments, interfacial layer 240 includes dielectric material, such as SiO, and may be formed by a deposition process such as CVD, PVD, ALD, or other deposition process. Gate dielectric layer 242 includes a high-k dielectric material such as SiN, SiO, hafnium oxide (HfO), zirconium oxide, lanthanum oxide, titanium oxide, yttrium oxide, strontium titanite, other suitable metal-oxides, or combinations thereof; and may be formed by ALD and/or other suitable methods. Referring to FIG. 5A, gate dielectric layer 242 includes a bottom portion 242B disposed over interfacial layer 240, side portions 242S disposed along sidewalls of gate spacers 214, and top portions 242T disposed over gate spacers 214 and the first ILD layer 230. In some embodiments, gate dielectric layer 242 has a thickness of about 1.5 nm to about 3 nm.

Figures 6A, 6B:
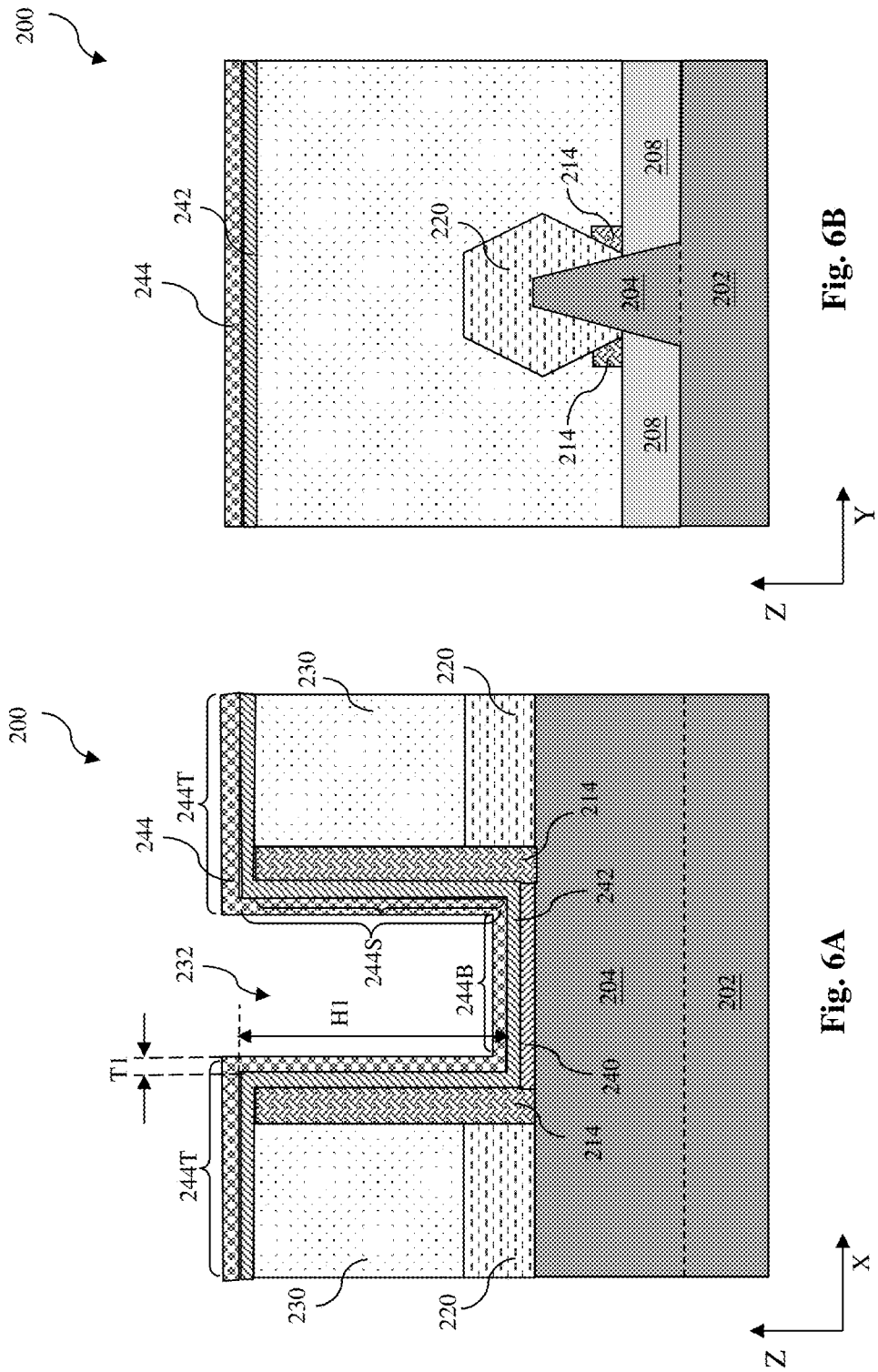

Now referring to FIGS. 1, 6A, 6B to 9A and 9B, at operation 108, a first sacrificial layer 244 is formed along the side portions 242S of the gate dielectric layer. Referring to FIGS. 6A and 6B, the first sacrificial layer 244 is formed over gate dielectric layer 242. The first sacrificial layer 244 includes a bottom portion 244B deposited over the bottom portion 242B of gate dielectric layer, side portions 244S deposited along the side portions 242S of gate dielectric layer, and top portions 244T deposited over the top portions 242T of gate dielectric layer. The first sacrificial layer 244 includes a material providing a different etch selectivity than gate dielectric layer 242, such as Si, SiGe, Ge, SiN, SiO, other suitable material, or combinations thereof. In some embodiments, the first sacrificial layer 244 is formed by ALD, CVD, PVD, other suitable deposition process, or combinations thereof. In some embodiments, a thermal process may be applied to the first sacrificial layer 244 to help reduce the density of the material and increase the chemical etching rate thereof. In some embodiments, the first sacrificial layer 244 is formed over gate dielectric layer 242 for a thickness T1 of about 1.5 nm to about 4 nm. In some embodiments, the side portions 244S of the first sacrificial layer have a height H1 of about 50 nm to about 100 nm, and a width/height ration of each side portion 244S of the first sacrificial layer is about 1.5% to about 10%. In some embodiments, the thickness T1 of the first sacrificial layer 244 is about 5% to about 25% of the width W (about 10 nm to about 30 nm) of gate trench 232.

Figures 9A, 9B:
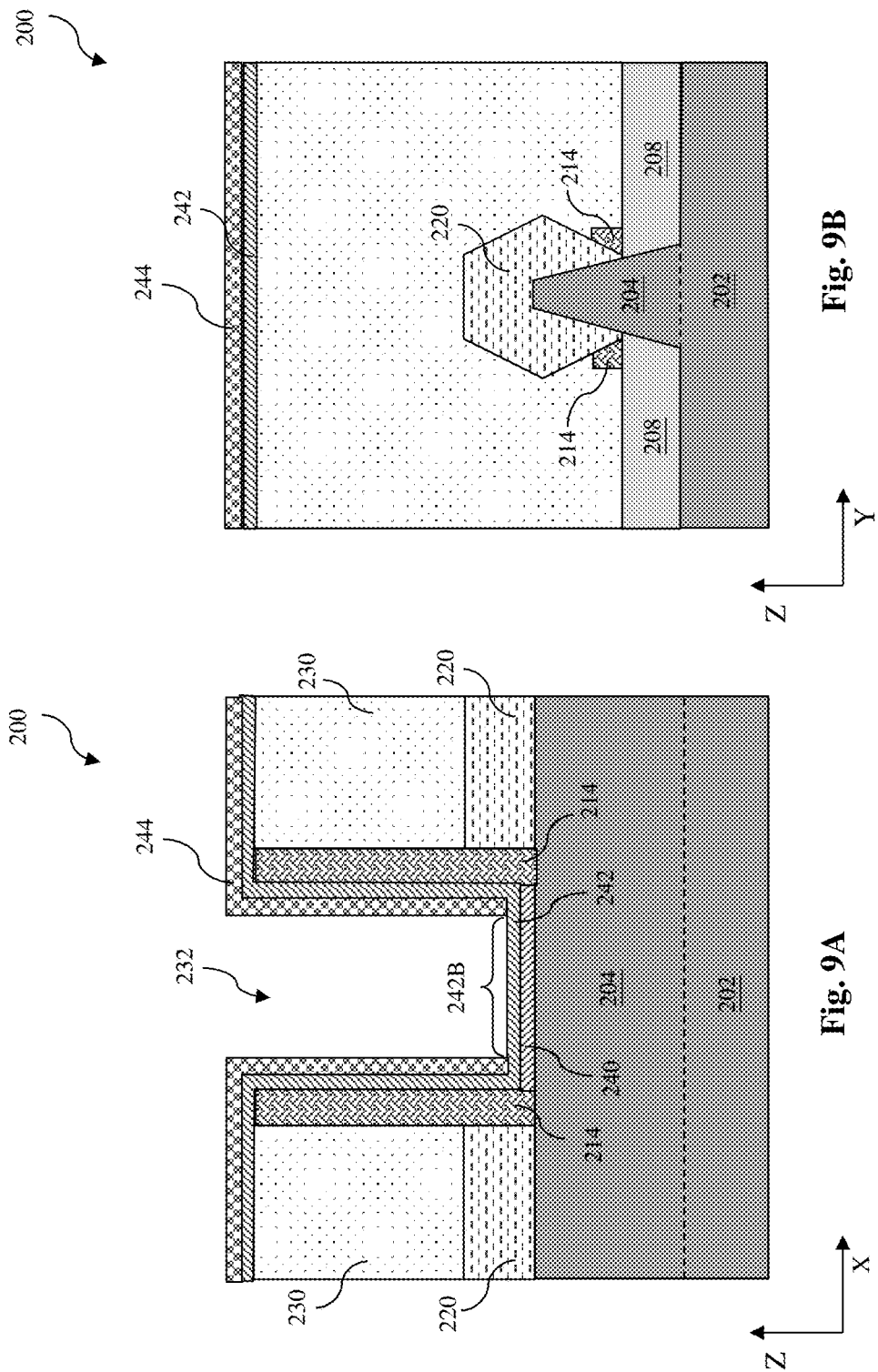
Figures 11A, 11B:
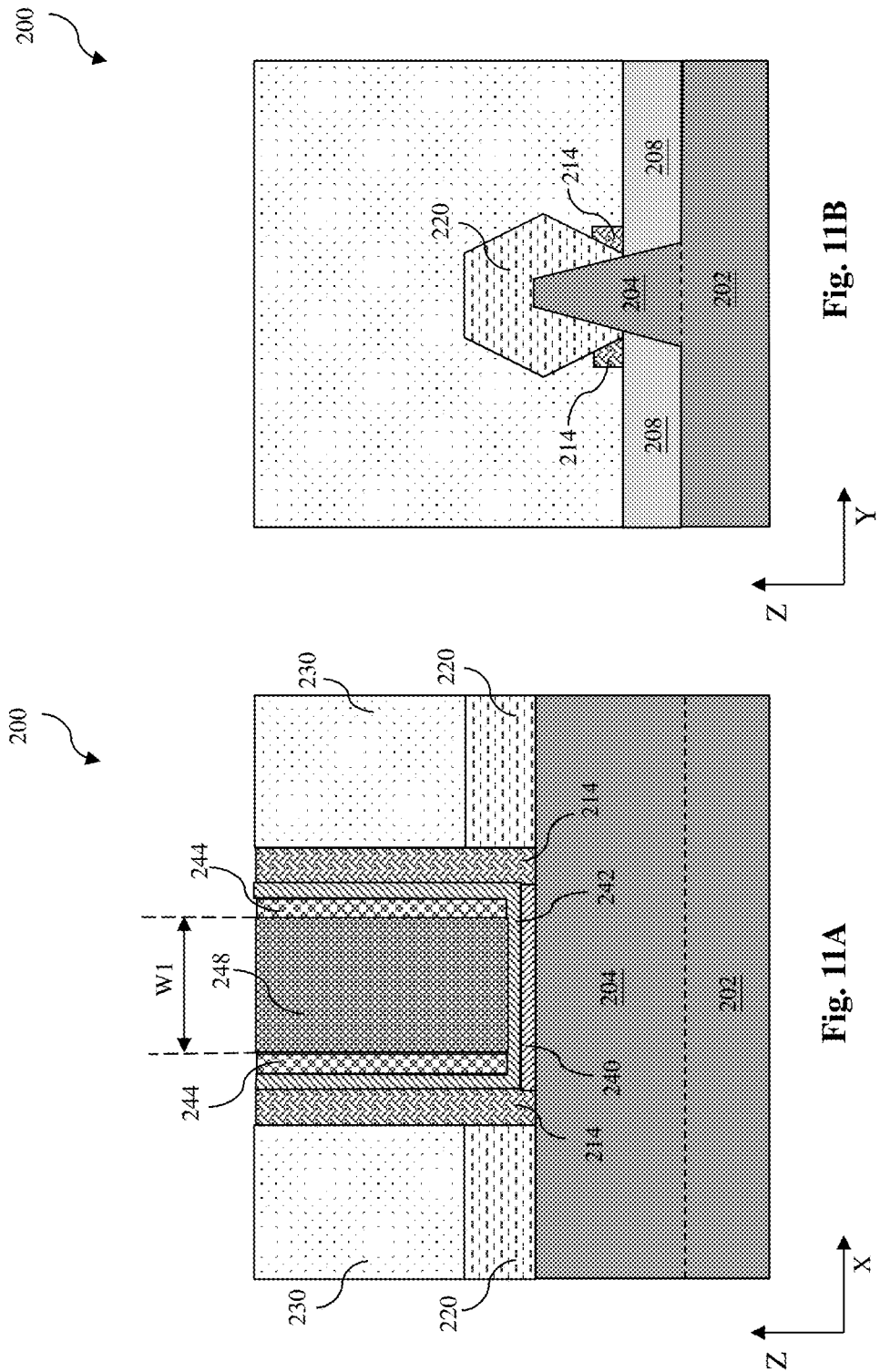

Referring to FIGS. 7A, 7B to 9A, 9B, the bottom portion 244B of the first sacrificial layer is removed. In some embodiments, a dry etching process is applied to remove the bottom portion 24B of the first sacrificial layer. In some embodiments, the dry etching uses an etchant including a bromine-containing gas (e.g., HBr), a methane gas (e.g., $CH_4$), other suitable gases, or combinations thereof. In some further embodiments, the etching gas also include a small amount (for example, about 5% to about 15%) of oxygen ($O_2$). Taking HBr as an example etching gas, as depicted in FIGS. 7A and 7B, the plasma source including H and Br ions are introduced into gate trench 232 with a direction that is substantially perpendicular to the bottom portion 244B of the first sacrificial layer. The H and Br ions keep knocking away the surface of the bottom portion 244B of the first sacrificial layer, such that the bottom portion 244B of the first sacrificial layer is removed. Meanwhile, the small amount of $O_2$ in the etching gas reacts with the side portions 244S and the top portions 244T of the first sacrificial layer to form a polymer layer 246, which works as a protection passivation layer to protect the side portions 244S and the top portions 244T of the first sacrificial layer from being knocked away by the H and Br ions. For example, the first sacrificial layer 244 comprises Si, a polymer layer 246 comprise $SiBr_xO_y$, is formed along the side portions 244S and over the top portions 244T of the first sacrificial layer. As depicted in FIG. 7A, polymer layer 246 formed along the side portions 244S may have a reduced thickness from the top to the bottom of the side portions 244S of the first sacrificial layer. For another example, in the case that the etching gas includes $CH_4$, the polymer layer 246 may comprise methylidyne (CH) polymer. FIGS. 8A and 8B depicted the semiconductor structures after the bottom portion 244B of the first sacrificial layer is removed. The bottom portion 242B of gate dielectric layer is exposed in gate trench 232 after removing the bottom portion 244B of the first sacrificial layer. Thereafter, referring to FIGS. 9A and 9B, polymer layer 246 is removed by a wet etching process. In some embodiments, the wet etching process may include an etchant such as hydrogen chloride (HCl), ammonium hydroxide ($NH_4OH$), hydrogen peroxide ($H_2O_2$), or combinations thereof After removing polymer layer 246, as depicted in FIG. 9A, the side portions 244S and the top portions 244T of the first sacrificial layer are remained, the bottom portion 242B of gate dielectric layer is exposed in gate trench 232. In some other embodiments, the bottom portion 244B of the first sacrificial layer may be removed by an anisotropical dry etching process.

Now referring to FIGS. 1, 10A, 10B, 11A and 11B, at operation 110, a gate electrode 248 is formed within gate trench 232. In some embodiments, gate electrode 248 may include a work function metal layer and a metal fill layer. The work function metal layer may be a p-type work function metal layer or an n-type work function metal layer. The p-type work function metal layer comprises a metal selected from, but not limited to, the group of titanium nitride, tantalum nitride, ruthenium, molybdenum, tungsten, platinum, or combinations thereof. The n-type work function metal layer comprises a metal selected from, but not limited to, the group of titanium, aluminum, tantalum carbide, tantalum carbide nitride, tantalum silicon nitride, or combinations thereof. The p-type or n-type work function metal layer may include a plurality of layers and may be deposited by CVD, PVD, and/or other suitable process. In some embodiments, the metal fill layer may include aluminum, tungsten, cobalt, copper, and/or other suitable materials, and may be formed by CVD, PVD, plating, and/or other suitable processes. In some embodiments, the gate electrode 248 may also include one or more other layers such as a barrier layer, a glue layer, and/or a hard mask layer. Referring to FIGS. 10A and 10B, first, conductive material(s) are deposited within gate trench 232 and over the top portions 244T of the first sacrificial layer. Thereafter, referring to FIGS. 11A and 11B, a CMP process is performed to remove the excess conductive materials and the top portions 244T of the first sacrificial layer and the top portions 242T of gate dielectric layer, thereby to planarize a top surface of device 200 and expose top surfaces of gate spacers 214 and the first ILD layer 230. The remained conductive material(s) forms gate electrode 248. In some embodiments, the width W of gate electrode in the X-direction is about 10 nm to about 30 nm. And, regarding the first sacrificial layer 244, since the top portions 244T of the first sacrificial layer is removed by the CMP, only the side portions 244S between gate electrode 248 and gate dielectric layer 242 are remained and exposed from the top of device 200.

Figures 13A, 13B:
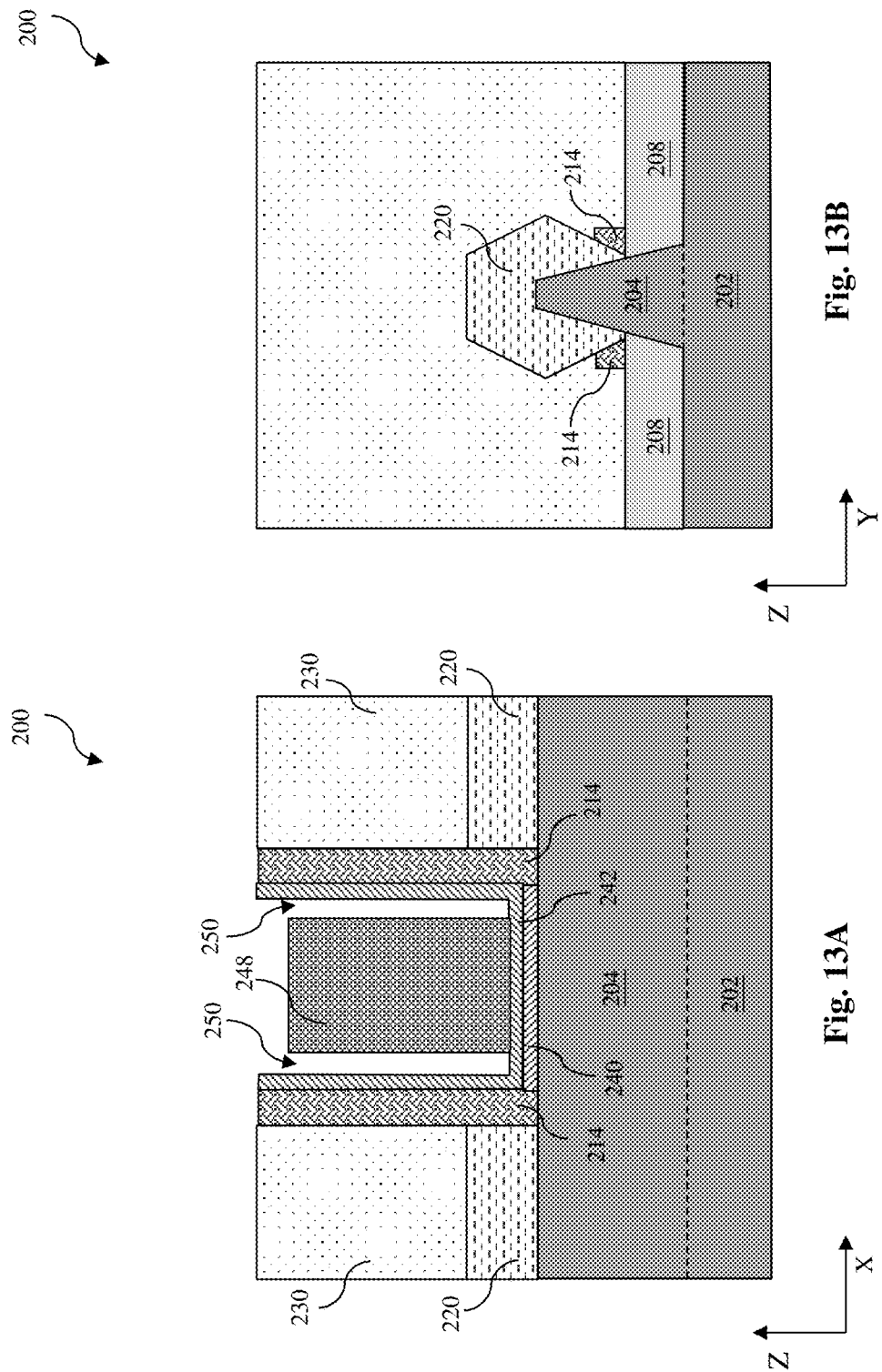

Now referring to FIGS. 1, 12A, 12B, 13A and 13B, at operation 112, removing the side portions 244S of the first sacrificial layer to form a gate air gap 250 between gate electrode 248 and the side portions 242S of gate dielectric layer. Referring to FIGS. 12A and 12B, first, a top portion of gate electrode 248 may be removed by a suitable process (for example, an etching process including wet etching, dry etching, or combinations thereof). Therefore, a top surface of gate electrode 248 is lower than a top surface of the remained side portions 244S of the first sacrificial layer which is substantially in the same planar with a top surface of the side portions 242S of gate dielectric layer, a top surface of gate spacers 214, and a top surface of the first ILD layer 230. Thereafter, referring to FIGS. 13A and 13B, the side portions 244S of the first sacrificial layer are removed by a suitable process. In some embodiment, since the material of the first sacrificial layer 244 has a different etch selectivity than the material of gate dielectric layer 242, the side portions 244S of the first sacrificial layer can be removed by a selective etching process. Therefore, as depicted in FIG. 13A, gate air gaps 250 are formed between gate electrode 248 and the side portions 242S of gate dielectric layer. In other words, gate electrode 248 is separated from the side portions 242S of gate dielectric layer by the gate air gaps 250. In some embodiments, the side portions 242S of gate dielectric layer and gate spacers 214 may be combined and referred to as integrated spacers.

Figures 14A, 14B:
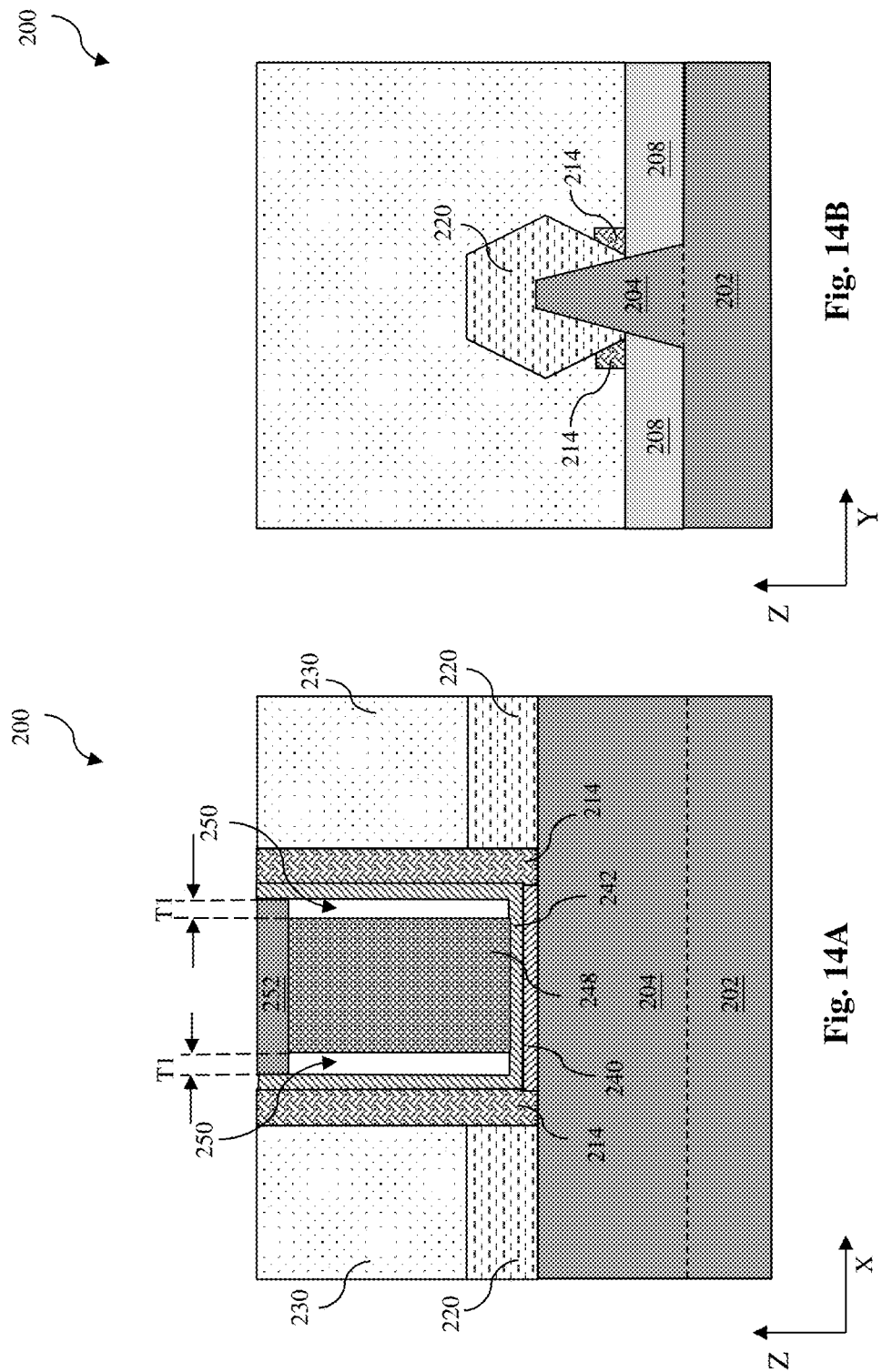

Now referring to FIGS. 1, 14A and 14B, at operation 114, a first protective layer 252 is formed over gate electrode 248 and cover the top openings of gate air gaps 250. In some embodiments, a dielectric material with high resistance against etching, such as high-density SiN (SiN with high doping concentration of carbon, for example, the doping concentration of carbon is about 5% to about 10%) is deposited over device 200 by a suitable deposition process such as CVD, PVD, ALD, other deposition process, or combination thereof. Due to the very low width/height ration of gate air gaps 250 (about 3% to 20%), the dielectric material does not fill up gate air gaps 250, and only enclose the top openings of gate air gaps 250. Thereafter, a planarization process, such as a CMP, may be performed to remove the excess dielectric material and expose top surfaces of gate dielectric layer 242, gate spacers 214 and the first ILD layer 230. The remained dielectric material forms the first protective layer 252. As depicted in FIG. 14A, sidewalls of the first protective layer 252 laterally contact at least a portion of the side portions 242S of gate dielectric layer, such that each gate air gaps 250 is enclosed by the first protective layer 252, gate dielectric layer 242, and gate electrode 248.

In a conventional semiconductor structure, due to the use of high-k dielectric layer, the middle end of line (MEOL) capacitance is increased, and the AC performance of the device is affected. In the present disclosure, the gate air gap formed between the metal gate electrode and the high-k gate dielectric layer can reduce the MEOL capacitance (or compensate the high MEOL capacitance due to the high-k material). In addition, the gate air gaps increase the distance between the metal gate electrode and the S/D contact (formed later) and increase the safe etching margin. For example, as depicted in FIG. 14A, the safe margin is increased by two times of the width T1 (about 1.5 nm to about 4 nm) of the gate air gap 250. Therefore, the gate air gaps formed between the metal gate electrode and the high-k dielectric layer can improve the reliability and performance of the semiconductor device.

Now referring to FIGS. 1, 15A, and 15B, at operation 116, portions of the first ILD layer 230 are removed to form S/D trenches 260 therein. In some embodiments, formation of S/D trenches 260 involves several processes, for example, lithography processes and/or etching processes. In some implementations, the lithography processes include forming a resist layer over the first ILD layer 230, exposing the resist layer to patterned radiation, and developing the exposed resist layer, thereby forming a patterned resist layer that can be used as a masking element for etching openings in the first ILD layer 230. The etching process includes dry etching, wet etching, other etching processes, or combination thereof. Thereby, S/D trenches 260 are formed within the first ILD layer 230 and top surfaces of epitaxial S/D features 220 are exposed in S/D trenches 260. In some embodiments, a width W2 of S/D trenches 260 in the X-direction is about 20 nm to about 40 nm.

Now referring to FIGS. 1, 16A, 16B to 18A, 18B, at operation 118, a second sacrificial layer 262 and a second protective layer 264 are formed along sidewalls of S/D trenches 260. Referring to FIGS. 16A and 16B, the second sacrificial layer 262 is deposited in S/D trenches 260 and over the first ILD layer 230, spacers 214, gate dielectric layer 242, and the first protective layer 252. Similar as the first sacrificial layer 244, the second sacrificial layer 262 includes bottom portions 262B deposited over the top surfaces of epitaxial S/D features 220 exposed in S/D trenches 260, side portions 262S deposited along sidewalls of S/D trenches 262, and top portions 262T deposited over the first ILD layer 230, spacers 214, gate dielectric layer 242, and the first protective layer 252. The second sacrificial layer 262 includes a material providing a different etch selectivity than the first ILD layer 230, such as Si, SiGe, low density SiN, low density SiO, other suitable material, or combinations thereof. In some embodiments, the second sacrificial layer 262 is deposited by ALD, CVD, PVD, other suitable deposition process, or combinations thereof. In some embodiments, the second sacrificial layer 262 is deposited for a thickness T2 of about 1.5 nm to about 4 nm. In some embodiments, the side portions 262S of the second sacrificial layer have a height H2 of about 85 nm to about 100 nm, thus a width/height ration of the side portion 244S of the second sacrificial layer is about 1.5% to about 5%. In some embodiments, the thickness T2 of the second sacrificial layer 262 is about 5% to about 10% of the width W2 of S/D trenches 260.

Figures 17A, 17B:
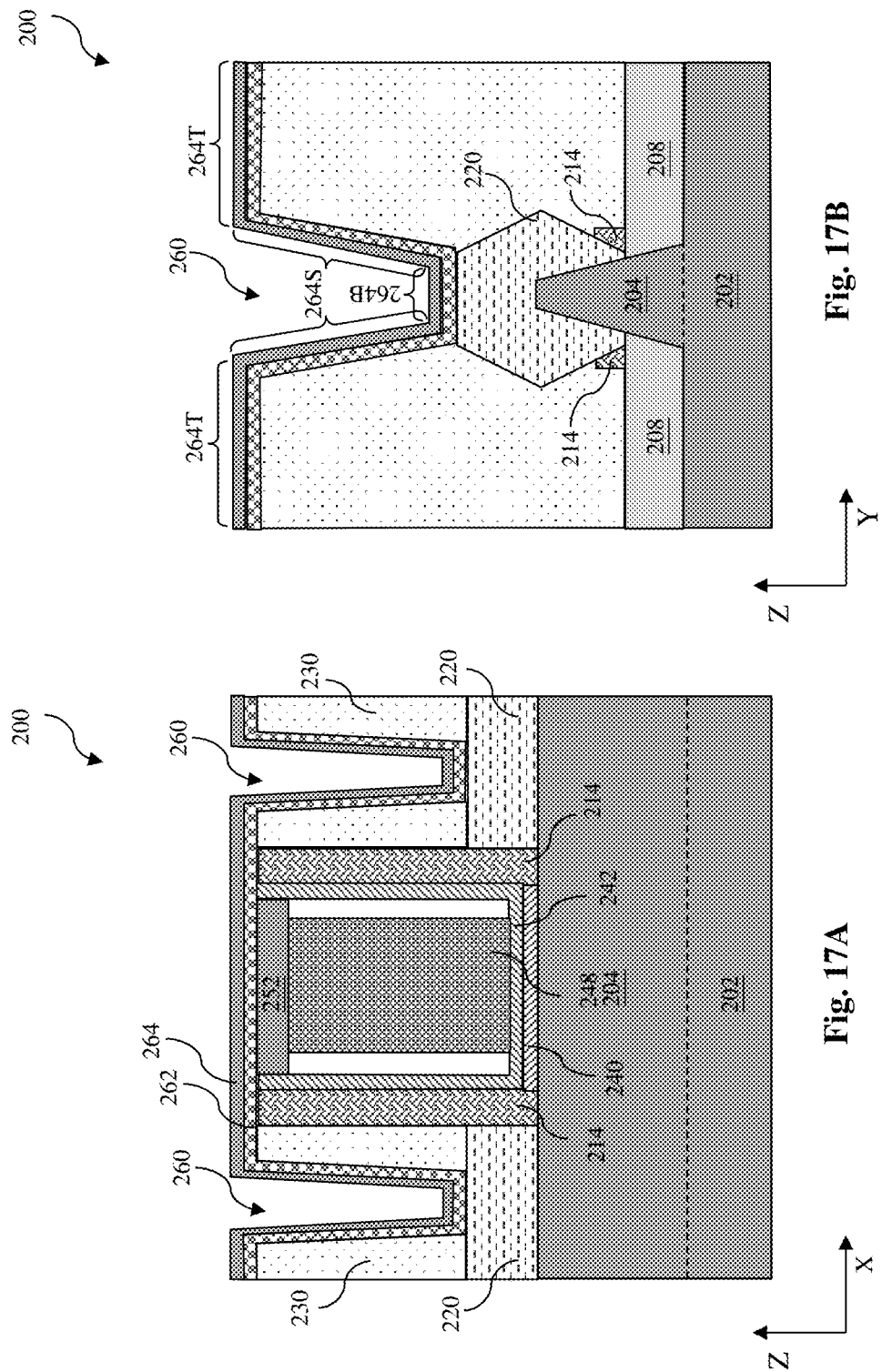

Referring to FIGS. 17A and 17B, a second protective layer 264 is formed over the second sacrificial layer 262. Similarly, the second protective layer 264 includes bottom portions 264B deposited over the bottom portions 262B of the second sacrificial layer, side portions 264S deposited along the side portions 262S of the second sacrificial layer, and top portions 264T deposited over the top portions 262T of the second sacrificial layer. In some embodiments, the second protective layer 264 includes a dielectric material that have a different etching selectivity than the material of the second sacrificial layer 262, such as the high-density SiN (for example, SiN with a doping concentration of carbon of about 5% to about 10%). In some embodiments, the second protective layer 264 is conformally deposited over the second sacrificial layer 262 by an ALD process for a thickness of about 1.5 nm to about 4 nm.

Referring to FIGS. 18A and 18B the bottom portions 262B and the top portions 262T of the second sacrificial layer, the bottom portions 264B and the top portions 264T of the second protective layer are removed. In some embodiments, the bottom portions 262B and the top portions 262T of the second sacrificial layer, the bottom portions 264B and the top portions 264T of the second protective layer are removed by an anisotropic dry etching process. In some other embodiments, the bottom portions 262B of the second sacrificial layer and the bottom portions 264B of the second protective layer are removed by combined etching processes similar as those to remove the bottom portion 244B of the first sacrificial layer. For example, the plasma ions introduced into S/D trenches 260 knocks away the surfaces of the bottom portions 264B of the second protective layer and further the surfaces of the bottom portions 262B of the second sacrificial layer, thereby to remove the bottom portions 264B and 262B. Meanwhile, the $O_2$ in the etching gas reacts with the side portions 264S and the top portions 264T of the second protective layer and forms a polymer layer along the side portion 264S and over the top portion 264T of the second protective layer. Thereafter, the polymer layer may be removed by a wet etching process. And, a CMP may be performed to remove the top portions 264T of the second protective layer and the top portions 262T of the second sacrificial layer. Thereby, the side portions 262S of the second sacrificial layer and the side portions 264S of the second protective layer are remained along sidewalls of S/D trenches 260.

Referring to FIGS. 1, 19A and 19B, at operation 120, conductive materials are deposited in S/D trenches 260 to form S/D contacts 266. In some embodiments, S/D contacts 266 may comprise tungsten (W), cobalt (Co), tantalum (Ta), titanium (Ti), aluminum (Al), zirconium (Zr), gold (Au), platinum (Pt), copper (Cu), ruthenium (Ru), metal compound such as titanium nitride (TiN), tantalum nitride (TaN), or combinations thereof. S/D contacts 266 may be formed by suitable deposition process, such as CVD, PVD, ALD, and/or other suitable process. A CMP process may be performed to remove any excess material of S/D contacts 266 and planarize the top surface of device 200.

Now referring to FIGS. 1, 20A and 20B, at operation 122, the remained portions (side portions) of the second sacrificial layer 262 is removed to form self-aligned S/D air gaps 270 between sidewalls of S/D contacts 266 and the first ILD layer 230. Since the material of the second sacrificial layer 262 has different etching selectivity than the materials of the first ILD layer 230 and the second protective layer 264, the second sacrificial layer 262 can be removed by a selective etching process. As depicted in FIG. 20A, the second protective layer 264 is surrounded S/D contacts 266, each S/D air gap 270 is formed between the second protective layer 264 and the first ILD 230. In other words, S/D contacts 266 is separated from the first ILD layer 230 by S/D air gaps 270 and is further separated from gate electrode 248 by S/D air gaps 270 and gate air gaps 250.

Figures 21A, 21B:
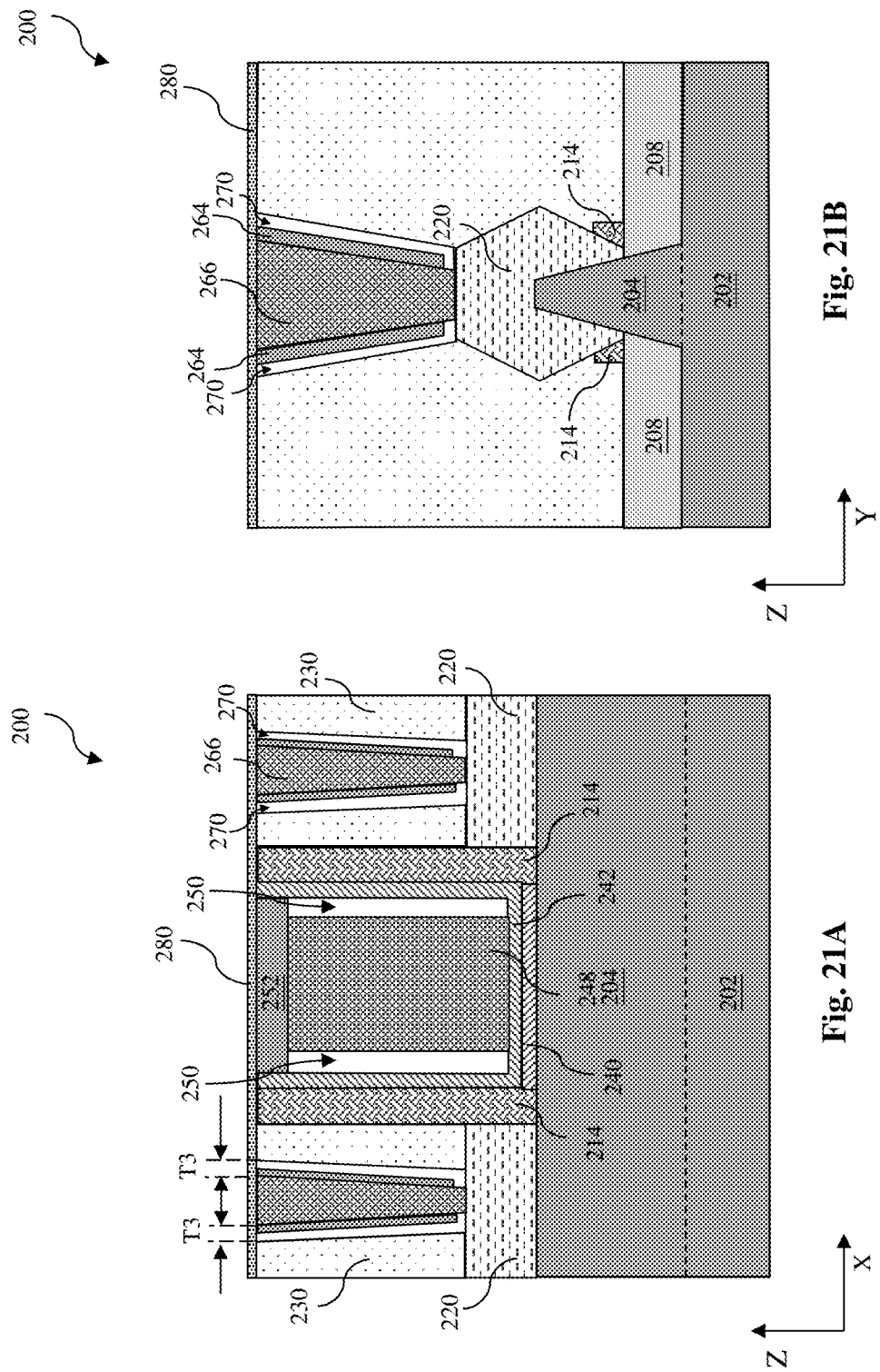

Now referring to FIGS. 1, 21A and 21B, an etch stop layer (ESL) 280 is deposited over substrate 202, especially over the first protective layer 252, gate dielectric layer 242, spacers 214, the first ILD layer 230, the second protective layer 264, and S/D contacts 266. As depicted in FIGS. 21A and 21B, material of ESL 280 does not fill up S/D air gaps 270 due to the low width/height ration of S/D air gaps 270, and ESL 280 covers the top openings of S/D air gap 270. In some embodiments, ESL 280 includes a dielectric material comprising silicon and nitrogen (for example, SiN or SiON). In some embodiments, ESL 280 may be formed by any proper deposition process, such as CVD, PVD, ALD, other deposition process, or combinations thereof.

In a conventional fabrication process, S/D air gaps are formed before the S/D contact plug formation. Thus, in case of an overlay shifting happened, there is a high risk that current shortage may occur between the metal gate and the S/D contact. However, in the present disclosure, the self-aligned S/D air gap is formed after the S/D contact plug in, which can mitigate the punch through issues between the metal gate and the S/D contact. In addition, similar as the gate air gap, the S/D air gap formed between the ILD layer and the S/D contact can reduce the front end of line (FEOL) and/or back end of line (BEOL) capacitances. And, with the S/D air gaps and the protective layers formed along both sides of the S/D contact, the safe etching margin are increased. For example, as depicted in FIG. 21A, the safe margin is increased by two times of the width T3 which is the combined thicknesses of the S/D air gap and the second protective layer. Therefore, the reliability and performance of the semiconductor device can be improved.

Figures 22A, 22B:
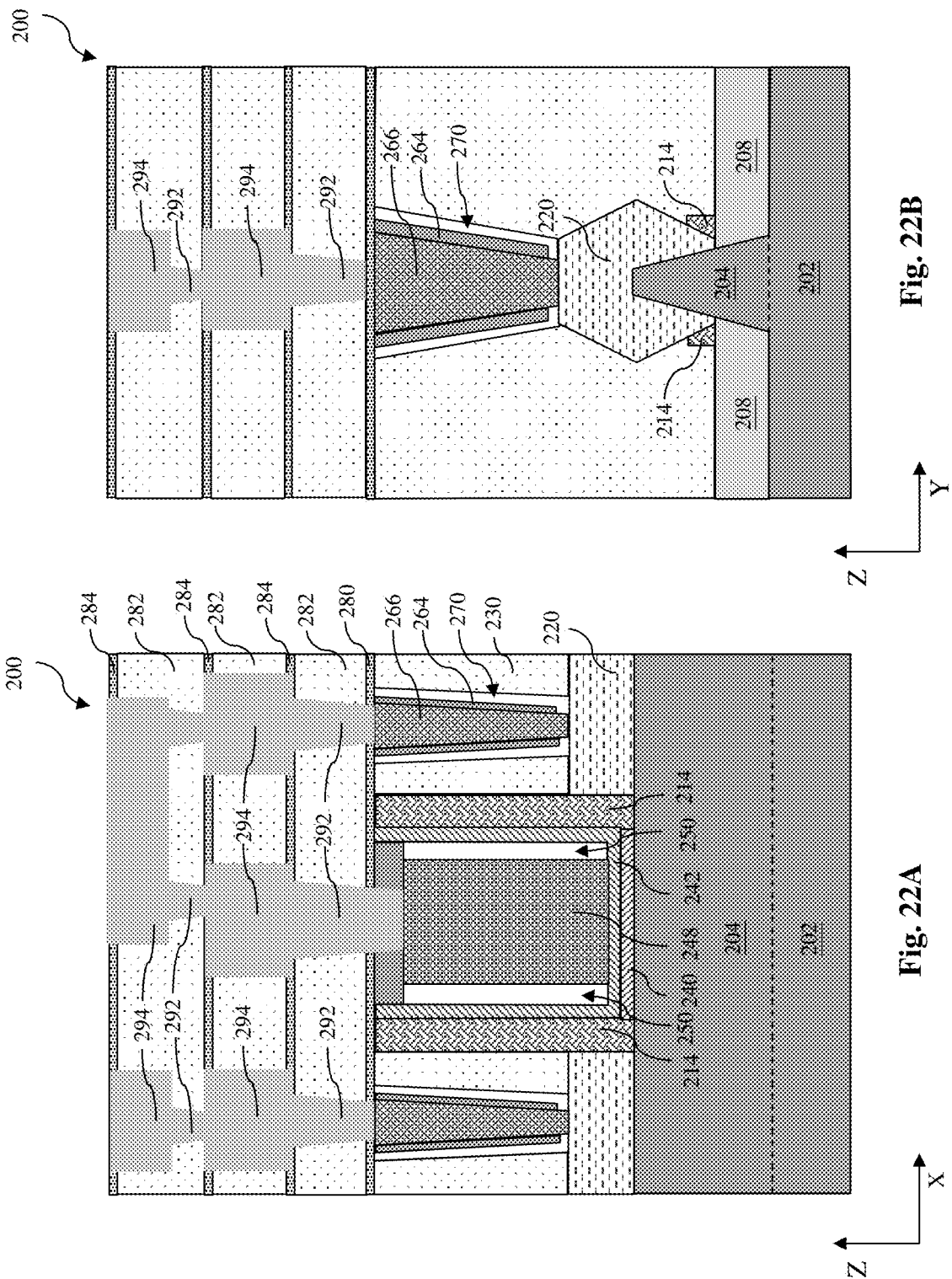

Now referring to FIGS. 1, 22A and 22B, method 100 performs further processing to complete the fabrication of device 200. For example, it may form various other contacts/vias 292, metal lines 294, as well as other multilayer interconnect features such as ILD layers 282 and ESLs 284 over device 200, configured to connect the various features to form a functional circuit that may include the semiconductor device.

Figure 23:
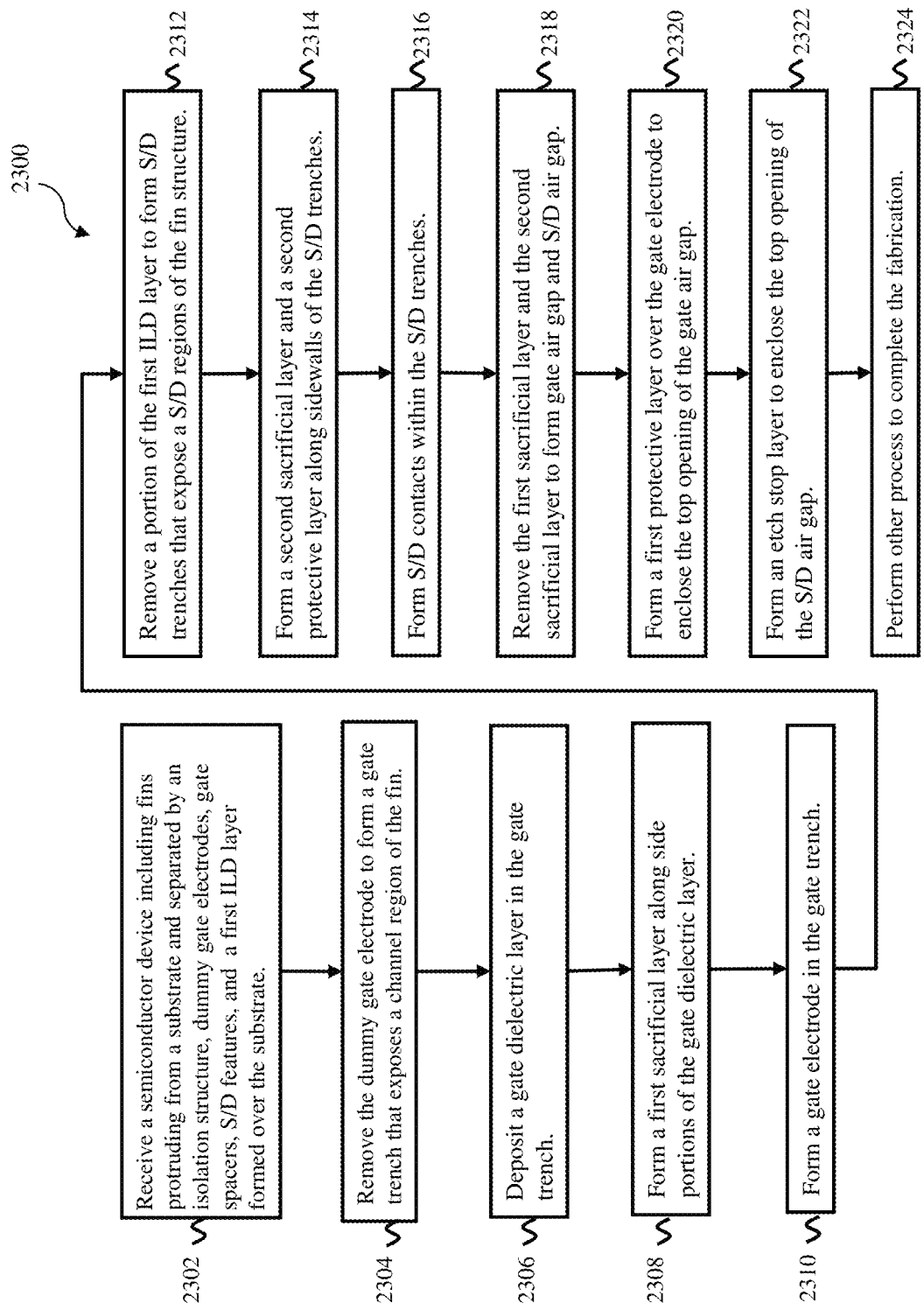
FIG. 23 illustrates another flowchart of another example method for making a semiconductor device in accordance with some other embodiments of the present disclosure.
Figures 25A, 25B:
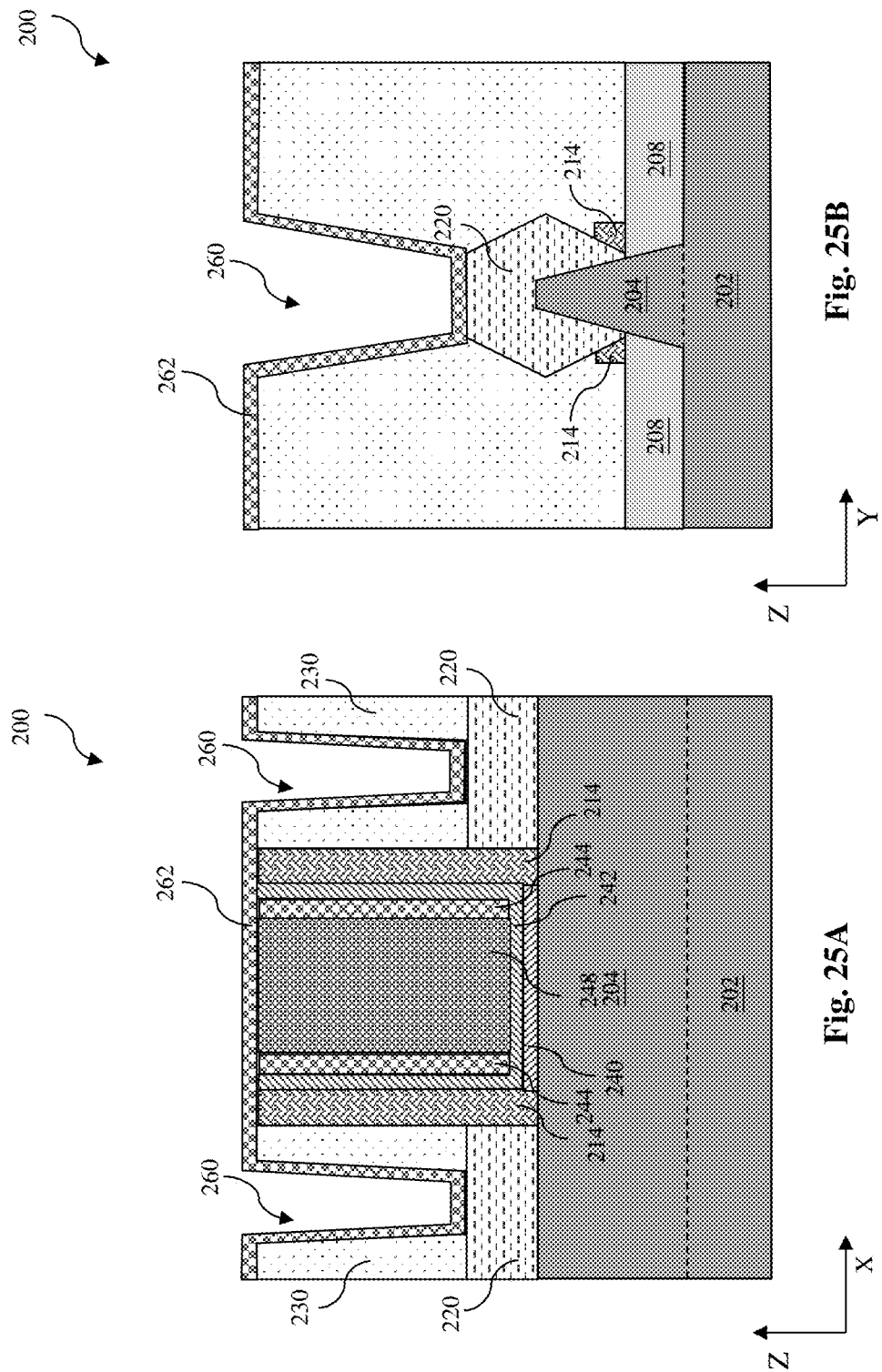
Figures 26A, 26B:
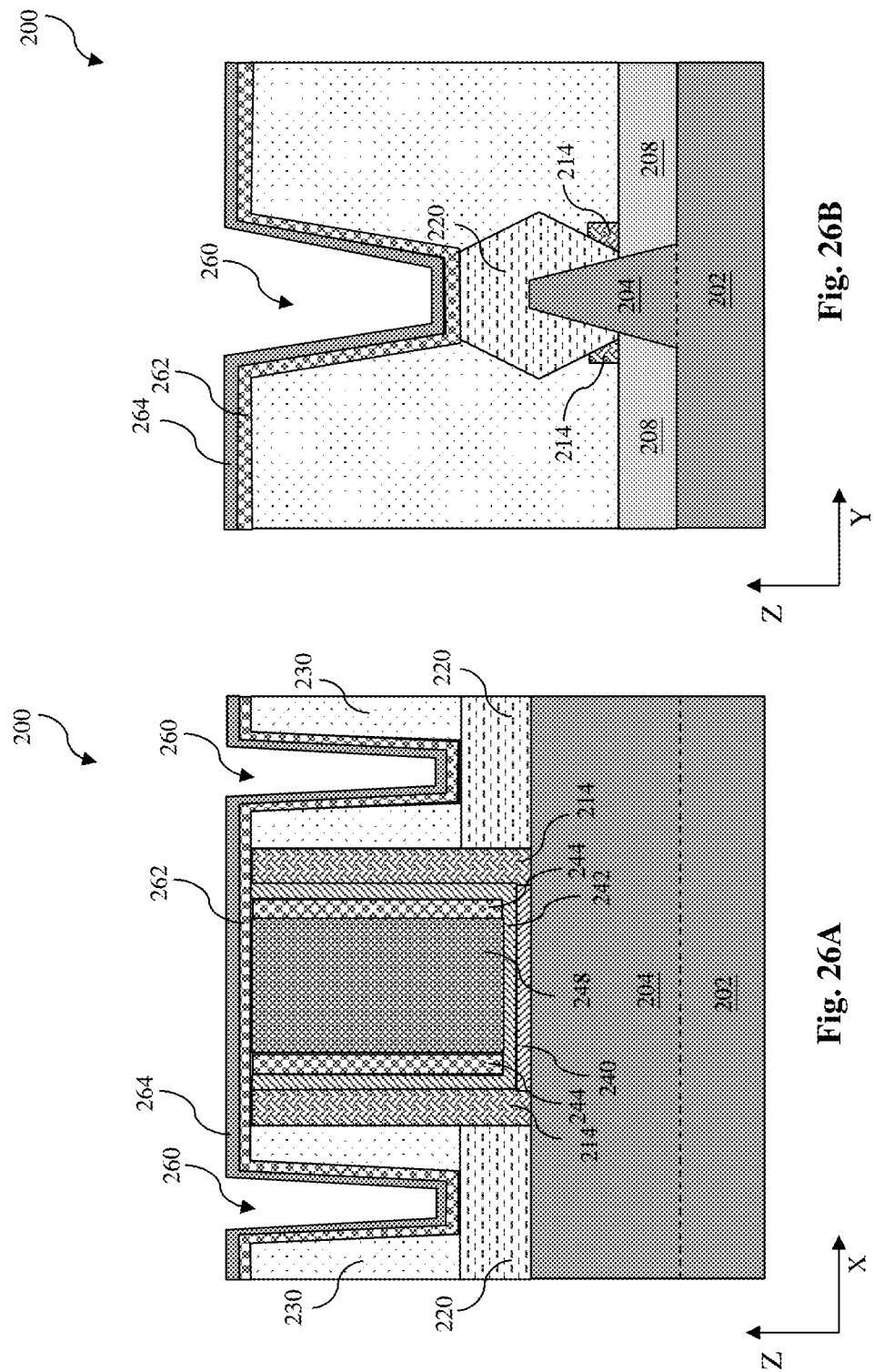
Figures 27A, 27B:
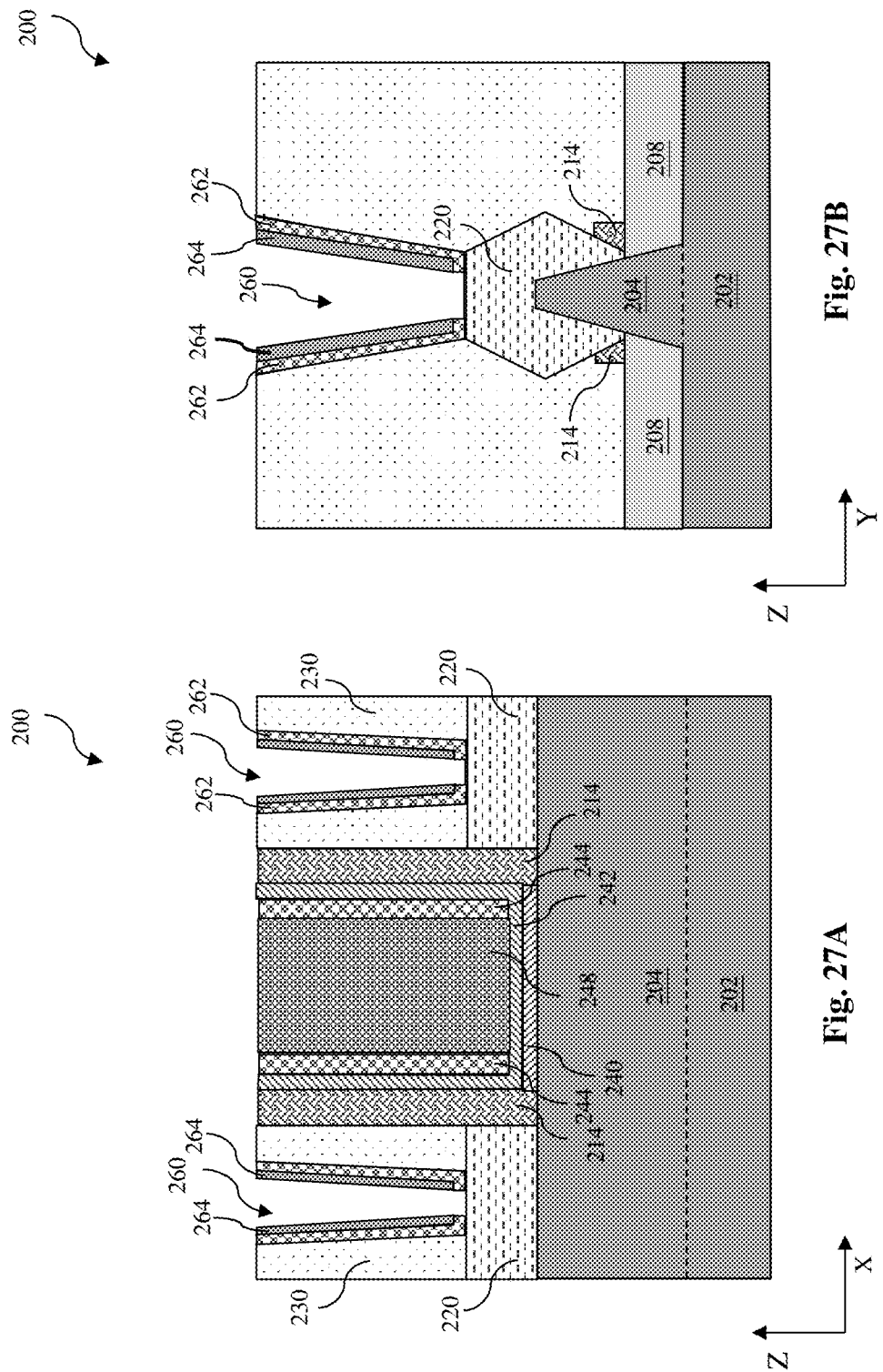

FIG. 23 illustrates a flow chart of a method 2300 for forming device 200 in accordance with some other embodiments of the present disclosure. Method 2300 is merely an example and is not intended to limit the present disclosure beyond what is explicitly recited in the claims. Additional operations can be performed before, during, and after method 2300, and some operations described can be replaced, eliminated, or moved around for additional embodiments of the method. Method 2300 includes similar steps as method 100. Method 2300 also includes different steps, or different order of steps than those in method 100. For example, steps 2302 to 2310 of method 2300 are similar to steps 102 to 110 of method 100, respectively. Steps 2312 to 2426 of method 2300 are in different orders than steps 112 to 126 of method 100 to form device 200. Steps 2312 to 2426 of method 2300 in FIG. 23 are described below in conjunction with other figures, which illustrate various cross-sectional views of device 200 during intermediate steps of method 2300. In particular, FIGS. 24A-32A illustrate cross-sectional views of device 200 taken along plane A-A' shown in FIGS. 2A and 2B (that is, along an X-direction). FIGS. 24B-32B illustrate cross-sectional views of device 200 taken along plane B-B' shown in FIGS. 2A and 2B (that is, along a Y-direction).

Referring to FIGS. 23, 24A and 24B, at operation 2312, after forming gate electrode 248 in gate trench 232, portions of the first ILD layer 230 are removed to form S/D trenches 260 therein. Formation of S/D trenches 260 are similar as operation 116 of method 100. For example, lithography processes and/or etching processes are involved in the formation of S/D trenches 260. Therefore, top surfaces of epitaxial S/D features 220 are exposed in S/D trenches 260.

Now referring to FIGS. 23, 25A, 25B to 27A, 27B, at operation 2314, a second sacrificial layer 262 and a second protective layer 264 are formed along sidewalls of S/D trenches 260. Formation of the second sacrificial layer 262 and the second protective layer 264 are similar to operation 118 of method 100. For example, referring to FIGS. 25A and 25B, the second sacrificial layer 262 is deposited (for example, by CVD, PVD, ALD, etc.) in S/D trenches 260 and over the first ILD layer 230, spacers 214, gate dielectric layer 242, and the first protective layer 252. Referring to FIGS. 26A and 26B, the second protective layer 264 is deposited (for example, by CVD, PVD, ALD, etc.) over the second sacrificial layer 262. And, referring to FIGS. 27A and 27B, the bottom portions of the second sacrificial layer 262 and the second protective layer 264 are removed (for example, by a combination of dry etching and wet etching similar as operation 118 of method 100) as well as the top portions of the second sacrificial layer 262 and the second protective layer 264 (for example, by CMP), such that only the side portions of the second sacrificial layer 262 and the side portions of the second protective layer 264 are remained along sidewalls of S/D contact trenches 260. The second sacrificial layer 262 includes a material providing a different etch selectivity than the first ILD layer 230 and the second protective layer 264. In some embodiments, a thickness of the second sacrificial layer 262 is about 1.5 nm to about 4 nm and a thickness of the second protective layer 264 is about 1.5 nm to about 4 nm. In some embodiments, the side portions of the second sacrificial layer have a height of about 85 nm to about 100 nm, thus a width/height ration of the side portions of the second sacrificial layer is about 1.5% to about 5%.

Figures 28A, 28B:
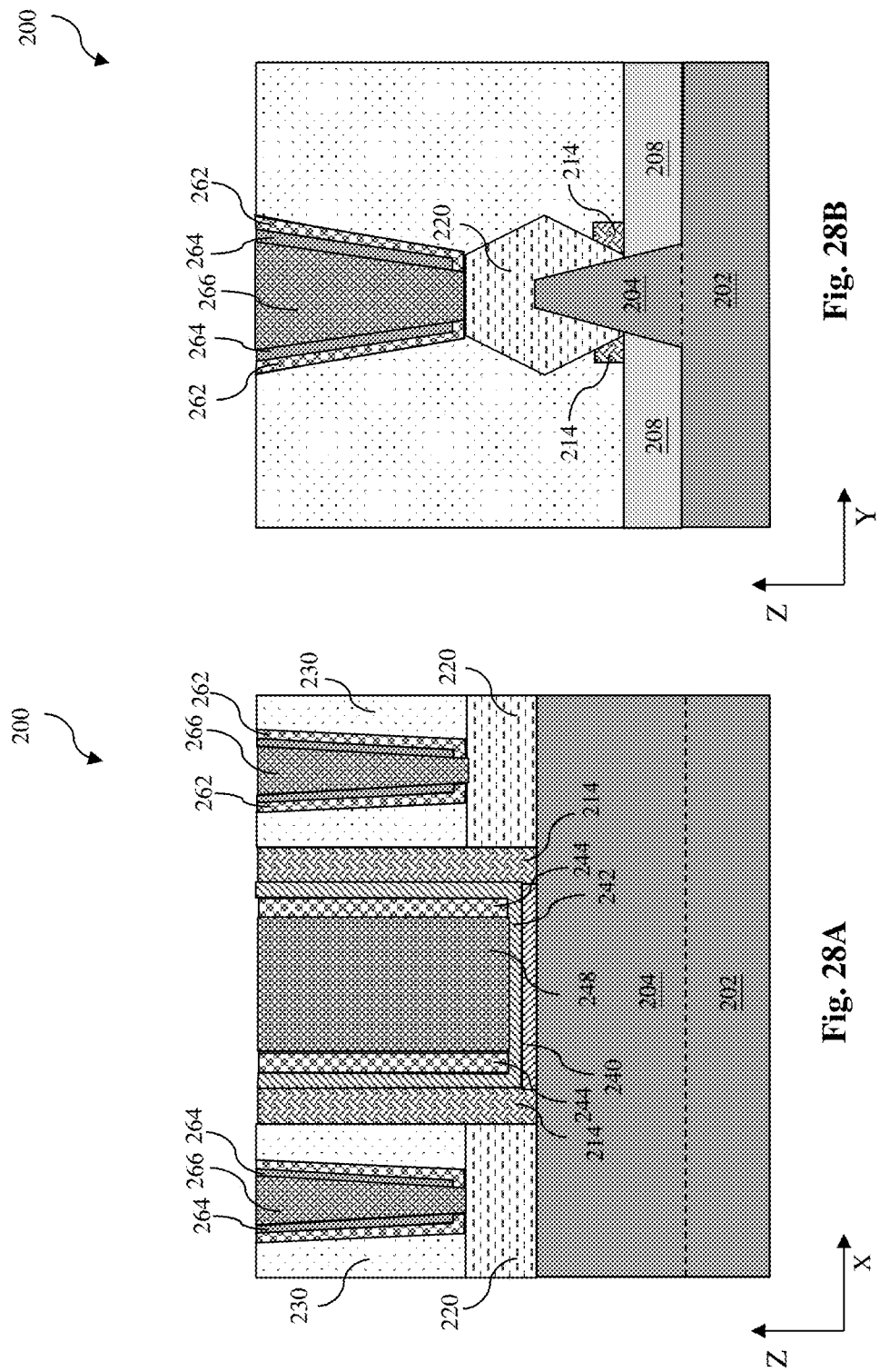

Referring to FIGS. 23, 28A and 28B, at operation 2316, conductive materials are deposited in S/D trenches 260 to form S/D contacts 266. In some embodiments, S/D contacts 266 comprises a conductive material and are formed by suitable deposition process, such as CVD, PVD, ALD, and/or other suitable process. A CMP process may be performed to remove any excess material of S/D contacts 266 and planarize the top surface of device 200.

Figures 29A, 29B:
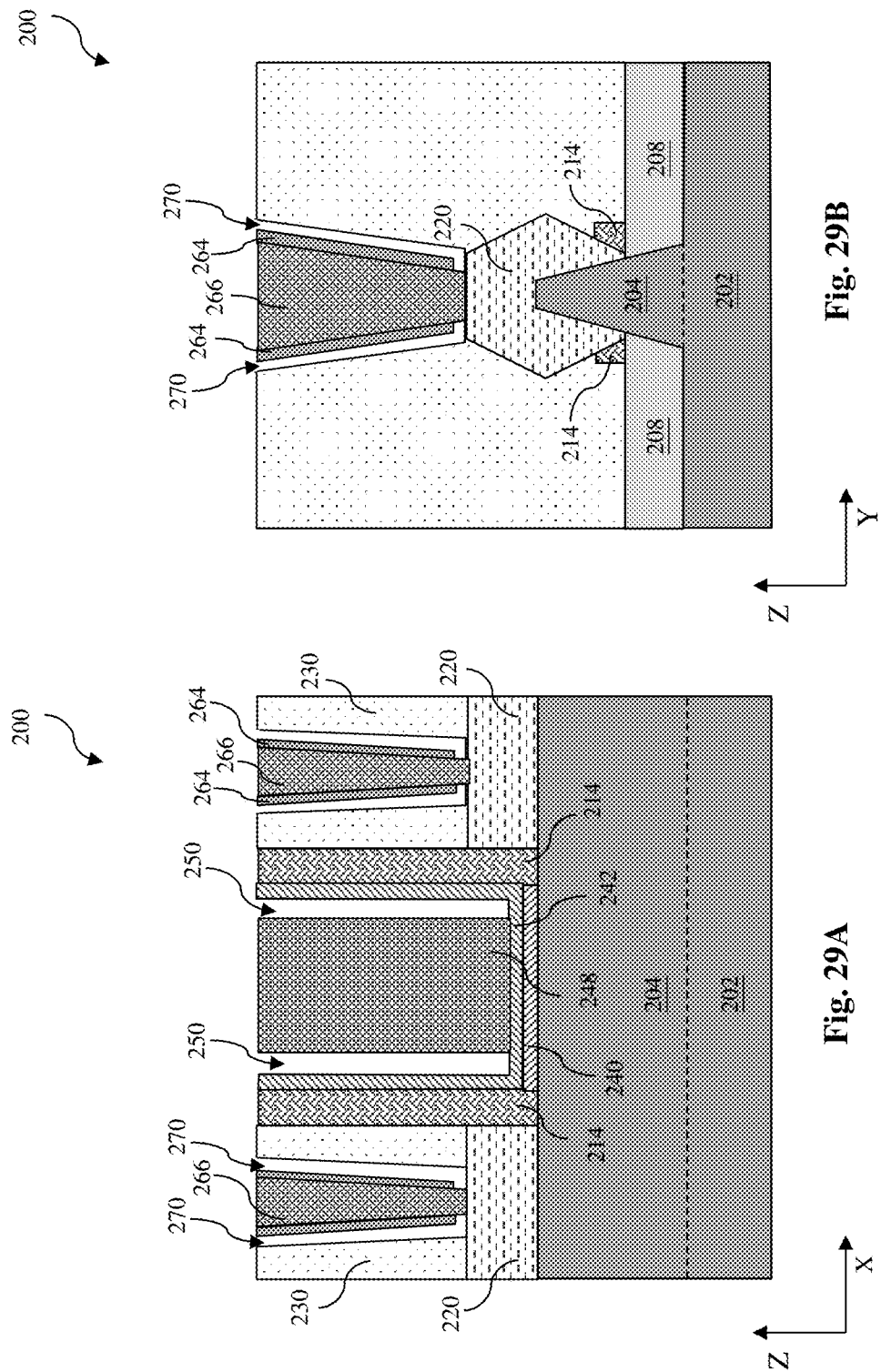

Now referring to FIGS. 23, 29A and 29B, at operation 2318, the remained portions of the first sacrificial layers 244 and the second sacrificial layers 262 are removed to form gate air gaps 250 and S/D air gaps 270, respectively. As depicted in FIGS. 29A, gate air gap 250 separates gate electrode 248 and gate dielectric layer 242, and S/D air gaps 270 separate S/D contacts 266 and the first ILD layer 230. Since the material of the first sacrificial layer 244 has a different etching selectivity than gate dielectric layer 242 and gate electrode 248, the first sacrificial layer 244 can be removed by a selective etching process. Since the material of the second sacrificial layer 262 has a different etching selectivity than the material of the first ILD layer 230 and the second protective layer 264, the second sacrificial layer 262 can be removed by a selective etching process.

Figures 30A, 30B:
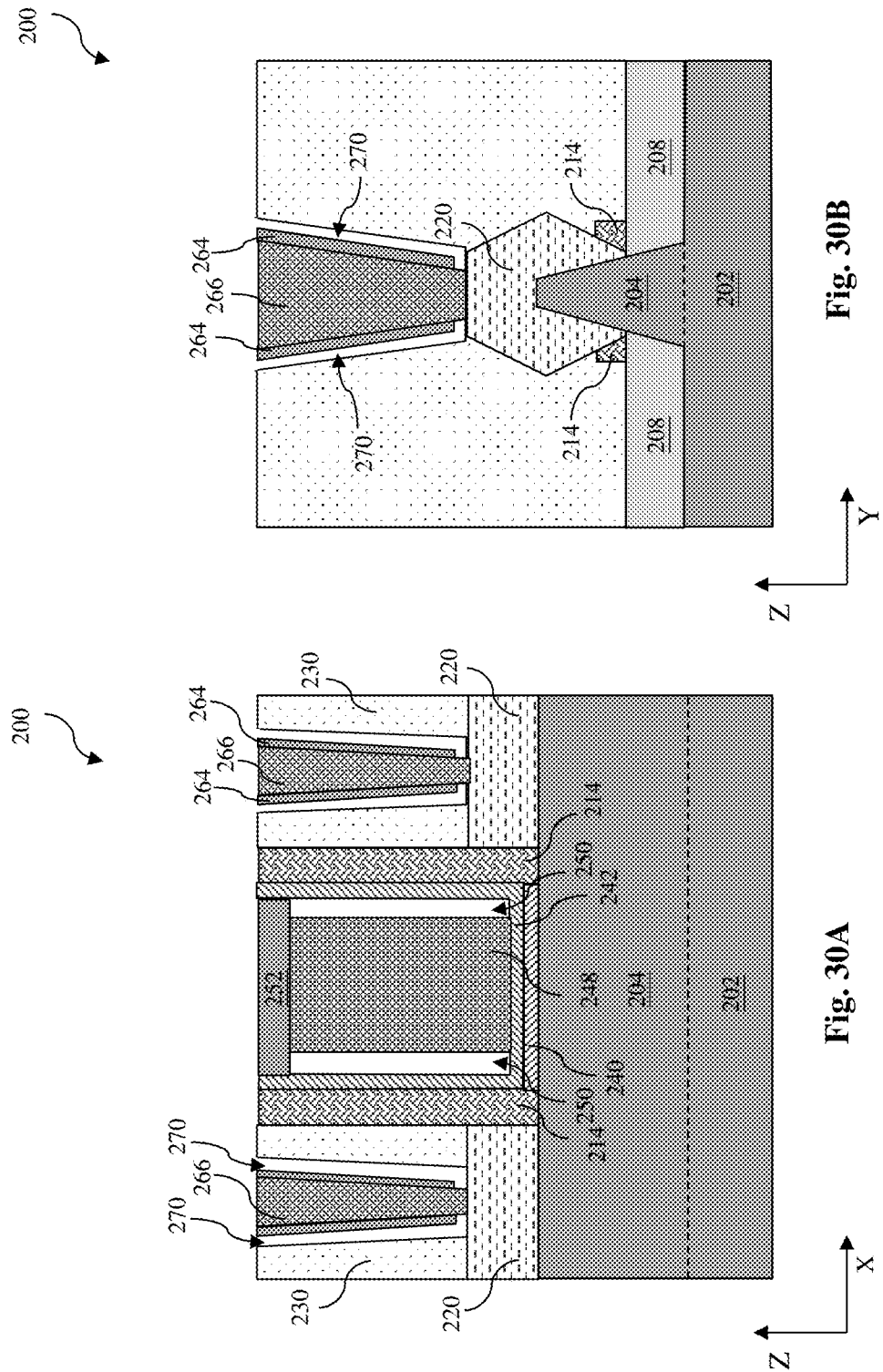

Now referring to FIGS. 23, 30A and 30B, a first protective layer 252 is formed over gate electrode 248 and cover the top opening of gate air gap 250. In some embodiments, first, a top portion of gate electrode 248 is recessed by a suitable process (for example, by an etching process including wet etching, dry etching, or combinations thereof). Thereafter, a first protective layer 252 is deposited over the recessed gate electrode 248 and enclose the top opening of gate air gap 250. In some embodiments, the first protective layer 252 includes a dielectric material, such as high-density SiN (for example, SiN with a doping concentration of carbon of about 5% to about 10%), and is deposited over device 200 by a suitable deposition process such as CVD, PVD, ALD, other deposition process, or combination thereof. A planarization process, such as a CMP, may be performed to remove the excess dielectric material of the first protective layer 252. As depicted in FIG. 30A, sidewalls of the first protective layer 252 laterally contacts at least a portion of the side portions of gate dielectric layer 242, such that gate air gap 250 can be enclosed by the first protective layer 252, gate dielectric layer 242, and gate electrode 248.

Now referring to FIGS. 23, 31A and 31B, an etch stop layer (ESL) 280 is deposited over substrate 202, specially over the first protective layer 252, gate dielectric layer 242, spacers 214, the first ILD layer 230, the second protective layers 264, and S/D contacts 266. As depicted in FIGS. 31A and 31B, ESL 280 covers the top openings of S/D air gap 270. Therefore, each S/D air gap is enclosed by the first ILD layer 230, the second protective layer 264, epitaxial S/D feature 220, and ESL 280. In some embodiments, ESL 280 includes a dielectric material such as SiO or SiN, and is deposited by any proper deposition process.

Now referring to FIGS. 23, 32A and 32B, method 2300 performs further processing to complete the fabrication of device 200. For example, it may form various other contacts/vias 292, metal lines 294, as well as other multilayer interconnect features such as ILD layers 282 and ESLs 284 over device 200, configured to connect the various features to form a functional circuit that may include the semiconductor devices.

Although not intended to be limiting, one or more embodiments of the present disclosure provide many benefits to a semiconductor device and a formation process thereof. For example, embodiments of the present disclosure provide a semiconductor device includes an air gap formed between the metal gate electrode and the high-k dielectric layer and an air gap formed between the device level ILD layer and the S/D contact. These air gaps formed between the gate electrode and the S/D contact can reduce the MEOL, FEOL, and/or BEOL parasitic capacitances, to enhance the AC performance and increase the speed of the semiconductor device. The air gaps can also mitigate the punch through issued between the metal gate and the S/D contact, thereby to provide better reliability and higher breakdown voltage for the semiconductor device. In addition, the air gaps can increase the safe etching margins for contact/via formation and improve the performance of the semiconductor device.

The present disclosure provides for many different embodiments. Semiconductor device having air gaps formed between metal gate and S/D contacts and methods of fabrication thereof are disclosed herein. An exemplary semiconductor device comprises a semiconductor fin formed on a substrate, and a gate structure disposed over a channel region of the semiconductor fin. The gate structure includes a gate dielectric layer and a gate electrode. The gate dielectric layer includes a bottom portion and a side portion, and the gate electrode is separated from the side portion of the gate dielectric layer by a first air gap.

In some embodiments, the gate structure further comprises a gate protective dielectric layer disposed over the gate electrode, wherein a sidewall of the gate protective dielectric layer laterally contacts the side portion of the gate dielectric layer such that the gate protective dielectric layer encloses a top opening of the first air gap. In some embodiments, the gate structure further comprises a gate spacer disposed along a sidewall of the gate dielectric layer facing away from the gate electrode. In some embodiments, the gate structure further includes an interfacial layer disposed between the bottom portion of the gate dielectric layer and the semiconductor fin.

In some embodiments, the semiconductor device further comprises an epitaxial S/D feature disposed over the semiconductor fin and being adjacent the gate structure; and a S/D contact disposed over the epitaxial S/D feature and separated from the gate structure by an interlayer dielectric (ILD) layer, wherein a second air gap is formed between a sidewall of the S/D contact and a sidewall of the ILD layer.

In some embodiments, the semiconductor device further comprises a S/D protective dielectric layer disposed surrounding the S/D contact, such that the second air gap is formed between a sidewall of the S/D protective dielectric layer and the sidewall of the ILD layer.

In some embodiments, the semiconductor device further comprises an etch stop layer (ESL) disposed over the gate structure and the S/D contact, wherein the ESL encloses a top opening of the second air gap.

An exemplary method comprises receiving a semiconductor structure including a semiconductor fin disposed over a substrate, a dummy gate structure disposed over a channel region of the semiconductor fin, an epitaxial source/drain (S/D) feature formed over the semiconductor fin and being adjacent the dummy gate structure, and an interlayer dielectric (ILD) layer disposed over the epitaxial S/D feature and the substrate; removing the dummy gate structure to form a first trench in the ILD layer; forming a gate dielectric layer in the first trench, wherein the gate dielectric layer includes a side portion and a bottom portion; forming a first sacrificial layer over the gate dielectric layer, wherein the first sacrificial layer includes a side portion along the side portion of the gate dielectric layer and a bottom portion above the bottom portion of the gate dielectric layer; removing the bottom portion of the first sacrificial layer to expose the bottom portion of the gate dielectric layer; depositing a gate electrode within the first trench; and removing the side portion of the first sacrificial layer to form a first air gap between the gate electrode and the side portion of the gate dielectric layer.

In some embodiments, the method further comprises removing a top portion of the gate electrode; and depositing a gate protective layer over the recessed gate electrode within the first trench, wherein the gate protective layer covers a top opening of the first air gap.

In some embodiments, the method further comprises removing a portion of the ILD layer to form a second trench; forming a second sacrificial layer in the second trench, wherein the second sacrificial layer includes a side portion and a bottom portion; removing the bottom portion of the second sacrificial layer to expose the epitaxial S/D feature from the second trench; depositing a S/D contact over the epitaxial S/D feature in the second trench; and removing the side portion of the second sacrificial layer to form a second air gap between the S/D contact and the ILD layer.

In some embodiments, the method further comprises forming a S/D protective layer over the second sacrificial layer and removing a bottom portion of the S/D protective layer before removing the bottom portion of the second sacrificial layer.

In some embodiments, the method further comprises depositing an etch stop layer (ESL) over the S/D contact to cover a top opening of the second air gap.

In some embodiments, removing the bottom portion of the first sacrificial layer includes performing a dry etch process to the first sacrificial layer, wherein the dry etch process removes the bottom portion of the first sacrificial layer and forms a polymer layer over the side portion of the first sacrificial layer; and performing a wet etch process to remove the polymer layer over the side portion of the first sacrificial layer. In some embodiments, 14. The method of claim 13, wherein the dry etch uses an etch gas of hydrogen bromide (HBr) or methane (CH4), and the etch gas includes oxygen (O2). In some embodiments, ions of the etch gas is applied in a direction that is perpendicular to a top surface of the substrate, thereby the bottom portion of the first sacrificial layer is removed, and the polymer layer is formed over the side portion of the sacrificial layer.

Another exemplary method comprises forming a dummy gate over a channel region of a semiconductor fin over a substrate; forming an epitaxial source/drain (S/D) feature over a S/D region of the semiconductor fin; depositing an interlayer dielectric (ILD) layer over the substrate; removing the dummy gate to form a gate trench in the ILD layer; forming a gate dielectric layer in the gate trench; forming a first sacrificial layer along sidewalls of the gate dielectric layer with an opening to expose a bottom portion of the gate dielectric layer; depositing a gate electrode over the bottom portion of the gate dielectric layer in the gate trench; removing a portion of the ILD layer over the epitaxial S/D feature to form a contact trench; forming a second sacrificial layer along sidewalls of the contact trench and exposing a top surface of the epitaxial S/D feature; depositing a S/D contact over the top surface of the epitaxial S/D feature in the contact trench; and removing the first sacrificial layer and the second sacrificial layer such that a first air gap is formed between the gate electrode and the gate dielectric layer and a second air gap is formed between the S/D contact and the ILD layer.

In some embodiments, forming a first sacrificial layer along sidewalls of the gate dielectric layer and exposing a bottom portion of the gate dielectric layer includes forming a first sacrificial layer over the gate dielectric layer; and removing a bottom portion of the first sacrificial layer to expose the bottom portion of the gate dielectric layer. In some embodiments, the bottom portion of the first sacrificial layer is removed by a dry etch process using an etch gas of hydrogen bromide (HBr) or methane (CH4).

In some embodiments, forming a second sacrificial layer along sidewalls of the contact trench and exposing a top surface of the epitaxial S/D feature includes forming a second sacrificial layer in the contact trench; and removing a bottom portion of the second sacrificial layer to expose a top surface of the epitaxial S/D feature.

In some embodiments, the method further comprises planarizing a top surface of the semiconductor device; removing a top portion of the gate electrode; depositing a gate protective layer over the gate electrode and the first air gap to cover a top opening of the first air gap; and depositing an etch stop layer (ESL) over the S/D contact, the second air gap, the gate dielectric layer, and the gate protective layer, wherein the ESL covers a top opening of the second air gap.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a fin structure disposed on a substrate;
a gate structure disposed on the fin structure, the gate structure including:
a gate dielectric layer;
a gate electrode disposed on the gate dielectric layer; and
a protective layer disposed on the gate electrode and interfacing with a first portion of a side surface of the gate dielectric layer, the side surface of the gate dielectric facing the gate electrode and a second portion of the side surface of the gate electrode being exposed to a first air gap, the first air gap extending between the side surface of the gate dielectric and the second portion of the side surface of the gate electrode.

2. The device of claim 1, wherein a bottom portion of the gate electrode interfaces with the gate dielectric layer.

3. The device of claim 1, further comprising:
an interlayer dielectric layer disposed on the gate structure;
a source/drain feature disposed on the fin structure; and
a second air gap extending from the source/drain feature to the interlayer dielectric layer.

4. The device of claim 1, wherein the gate dielectric layer extends to a greater height above the substrate than the gate electrode.

5. The device of claim 1, further comprising:
an etch stop layer disposed on the protective layer; and
a contact feature extending through the etch stop layer and the protective layer such that the contact feature interfaced with the gate electrode.

6. The device of claim 1, wherein the gate dielectric layer and the protective layer interface with the etch stop layer.

7. The device of claim 1, wherein the gate dielectric has a u-shaped cross-sectional profile.

8. The device of claim 1, wherein the first air gap extends an entire length of the gate electrode.

9. A device comprising:
a fin structure disposed on a substrate;
a gate structure disposed on the fin structure, the gate structure including:
a gate dielectric layer;
a gate electrode disposed on the gate dielectric layer; and
a first air gap extending from the gate dielectric layer to the gate electrode such that the gate dielectric layer and the gate electrode are exposed to the first air gap;
a source/drain feature disposed on the fin structure;
a contact feature interfacing with the source/drain feature; and
a second air gap extending from the contact feature to the source/drain feature such that the contact feature and the source/drain feature are exposed to the second air gap.

10. The device of claim 9, further comprising a first protective layer disposed on the contact features and exposed to the second air gap.

11. The device of claim 10, wherein the first protective layer includes a bottom surface facing the substrate, the bottom surface of the first protective layer being exposed to the second air gap.

12. The device of claim 9, further comprising a sidewall spacer disposed on the gate structure, and
wherein the gate electrode is recessed relative to a top surface of the sidewall spacer.

13. The device of claim 12, wherein the sidewall spacer interfaces with the gate dielectric layer and is not exposed to the first air gap.

14. The device of claim 9, wherein the source/drain feature includes a top surface facing away from the substrate, and
wherein at least a portion of the top surface of the source/drain feature is exposed to the second air gap.

15. The device of claim 9, wherein the gate dielectric layer includes a high-k dielectric material and the gate electrode includes a metal material.

16. A method comprising:
forming a first trench in an interlayer dielectric layer disposed on a substrate;
forming a gate dielectric layer in the first trench;
forming a first layer on the gate dielectric layer within the first trench;
removing a first portion of the first layer to expose a portion of the gate dielectric layer, wherein a second portion of the first layer remains disposed within the first trench after the removing of the first portion of the first layer;
forming a gate electrode within the first trench on the second portion of the first layer; and
removing the second portion of the first layer to form a first air gap between the gate electrode and the gate dielectric layer.

17. The method of claim 16, further comprising:
forming a source/drain feature on the substrate;
forming a second trench in the interlayer dielectric layer to expose the source/drain feature;
forming a second layer on the source/drain feature within the second trench;
removing a first portion of the second layer to expose a portion of the source/drain feature, wherein a second portion of the second layer remains disposed within the second trench after the removing of the first portion of the second layer;

forming a contact feature within the second trench on the second portion of the second layer; and removing the second portion of the second layer to form a second air gap between the contact feature and the interlayer dielectric layer.

18. The method of claim 17, wherein the removing of the second portion of the second layer to form the occurs during the same removal process as the removing of the second portion of the first layer to form the first air gap.

19. The method of claim 16, further comprising recessing the gate electrode prior to removing the second portion of the first layer to form the first air gap.

20. The method of claim 16, further comprising forming a protective layer directly on the recessed gate electrode, and wherein the protective layer interfaces with the gate electrode and the gate dielectric layer after forming the protective layer directly on the recessed gate electrode.

* * * * *